United States Patent
BrightSky

(10) Patent No.: US 10,622,562 B2
(45) Date of Patent: Apr. 14, 2020

(54) CROSSPOINT FILL-IN MEMORY CELL WITH ETCHED ACCESS DEVICE

(71) Applicant: International Business Machines Corporation, Armonk, NY (US)

(72) Inventor: Matthew J. BrightSky, Pound Ridge, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/352,443

(22) Filed: Mar. 13, 2019

(65) Prior Publication Data

US 2019/0214560 A1  Jul. 11, 2019

Related U.S. Application Data

(62) Division of application No. 15/816,751, filed on Nov. 17, 2017.

(51) Int. Cl.
*H01L 45/00* (2006.01)
*H01L 27/24* (2006.01)

(52) U.S. Cl.
CPC ...... *H01L 45/1683* (2013.01); *H01L 27/2409* (2013.01); *H01L 27/2463* (2013.01); *H01L 27/2481* (2013.01); *H01L 45/065* (2013.01); *H01L 45/1233* (2013.01); *H01L 45/1246* (2013.01); *H01L 45/144* (2013.01); *H01L 45/1608* (2013.01); *H01L 45/1616* (2013.01); *H01L 45/1666* (2013.01); *H01L 45/1675* (2013.01); *H01L 45/1691* (2013.01);

(Continued)

(58) Field of Classification Search
None
See application file for complete search history.

(56) References Cited

U.S. PATENT DOCUMENTS 6,943,365 B2 * 9/2005 Lowrey .................. G11C 11/56
257/3
7,791,057 B2  9/2010 Lung et al.
(Continued)

OTHER PUBLICATIONS

DC. Kau et al., "A stackable cross point phase change memory," International Electron Devices Meeting (IEDM), 2009, paper 27.1, pp. 617-620.

(Continued)

*Primary Examiner* — Minh Loan Tran
(74) *Attorney, Agent, or Firm* — L. Jeffrey Kelly, Esq.; Hoffman & Baron, LLP

(57) ABSTRACT

An illustrative method of fabricating a memory array structure includes: forming at least one access device layer on an upper surface of a first conductive layer, the access device layer being in electrical connection with the first conductive layer; forming a sacrificial layer on an upper surface of the access device layer; etching the access device layer and the sacrificial layer using a same masking feature to form an access device that is self-aligned with a portion of the sacrificial layer; replacing a portion of the sacrificial layer with memory storage material to form a storage element, a first terminal of the storage element being in electrical connection with the access device; and forming a second conductive layer on an upper surface of the storage element, a second terminal of the storage element being in electrical connection with the second conductive layer.

15 Claims, 28 Drawing Sheets

(52) U.S. Cl.
CPC ........ *H01L 27/249* (2013.01); *H01L 27/2427* (2013.01); *H01L 45/06* (2013.01); *H01L 45/124* (2013.01)

(56) References Cited

U.S. PATENT DOCUMENTS

| | | |
|---|---|---|
| 7,879,645 B2 | 2/2011 | Lung et al. |
| 7,884,342 B2 | 2/2011 | Lung |
| 8,614,117 B2 | 12/2013 | BrightSky et al. |
| 8,728,859 B2 | 5/2014 | Breitwisch et al. |
| 8,921,820 B2 | 12/2014 | BrightSky et al. |
| 8,981,330 B2 | 3/2015 | Lung |
| 9,136,307 B2 | 9/2015 | Pellizzer |
| 2008/0157053 A1* | 7/2008 | Lai .................. G11C 11/5678 257/4 |
| 2014/0264246 A1* | 9/2014 | Walls .................. H01L 45/1253 257/4 |

OTHER PUBLICATIONS

Y. Deng et al., "RRAM crossbar array with cell selection device: A device and circuit interaction study," IEEE Trans. on Electron Devices, vol. 60, No. 2, 2013, pp. 719-726.

\* cited by examiner

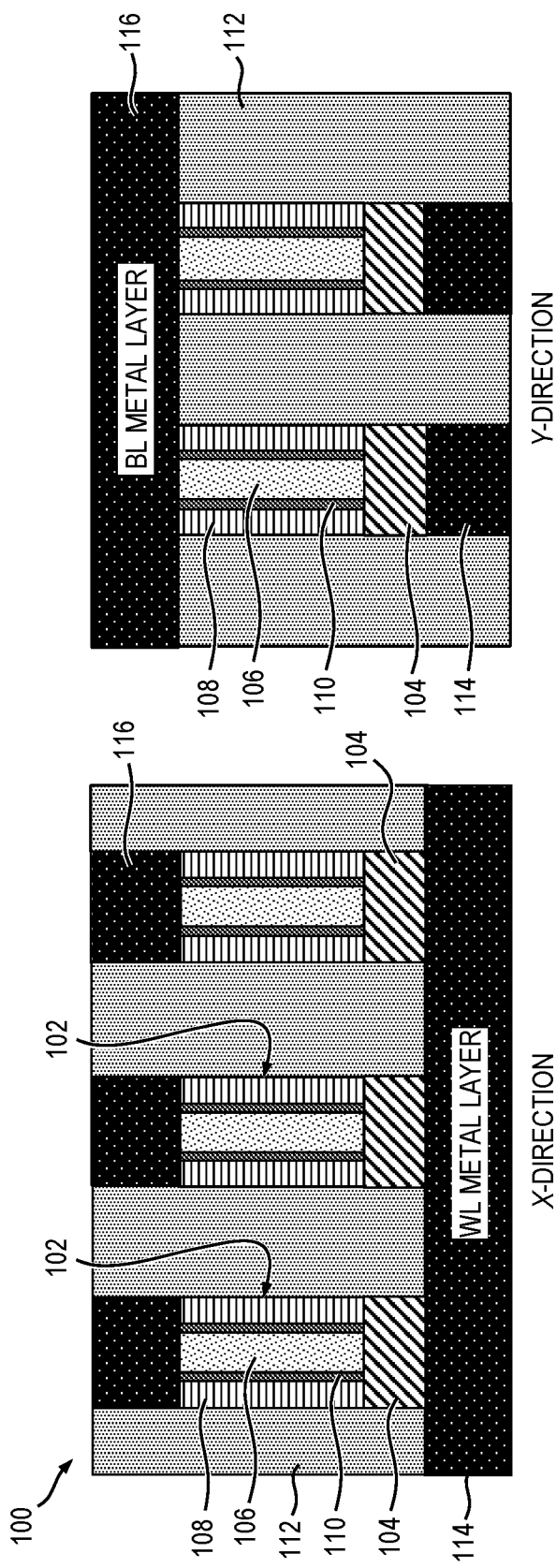
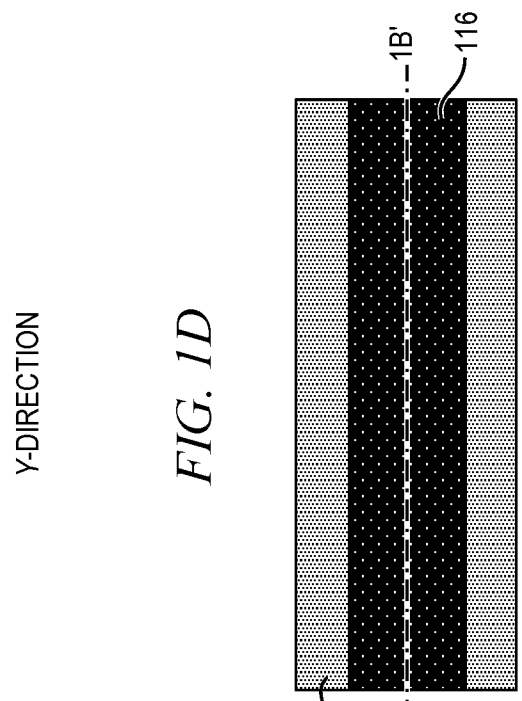
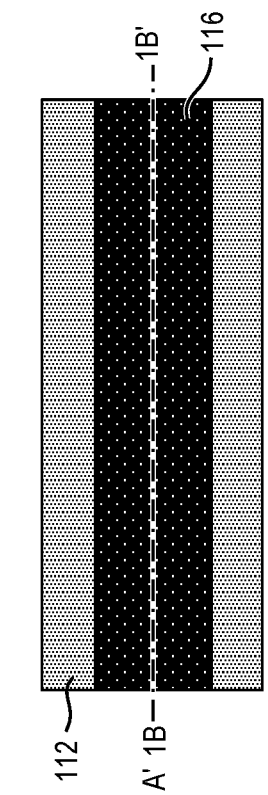
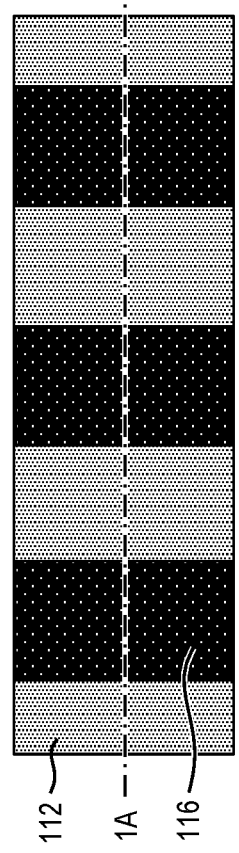
FIG. 1A
FIG. 1B
FIG. 1C
FIG. 1D

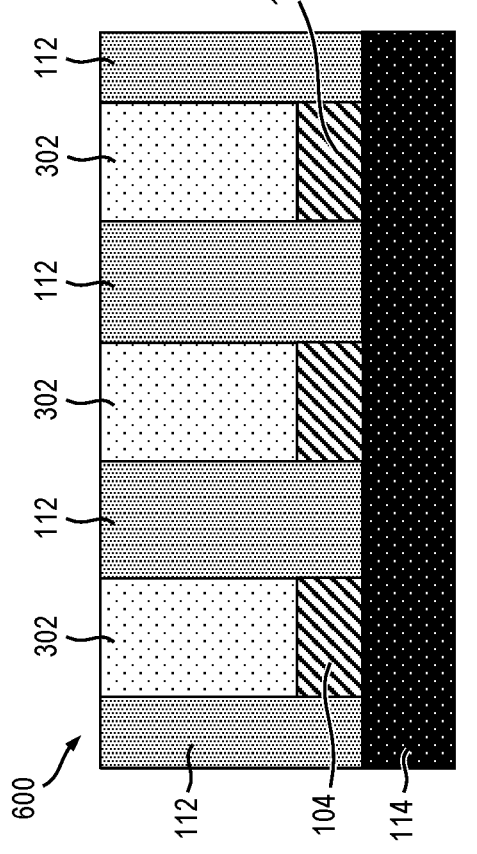
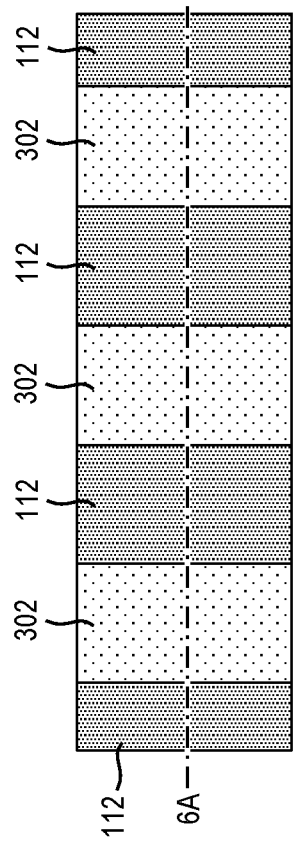
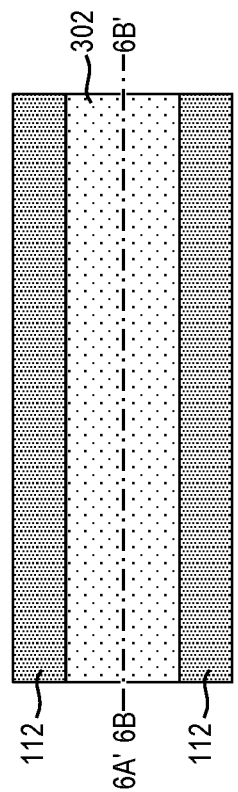

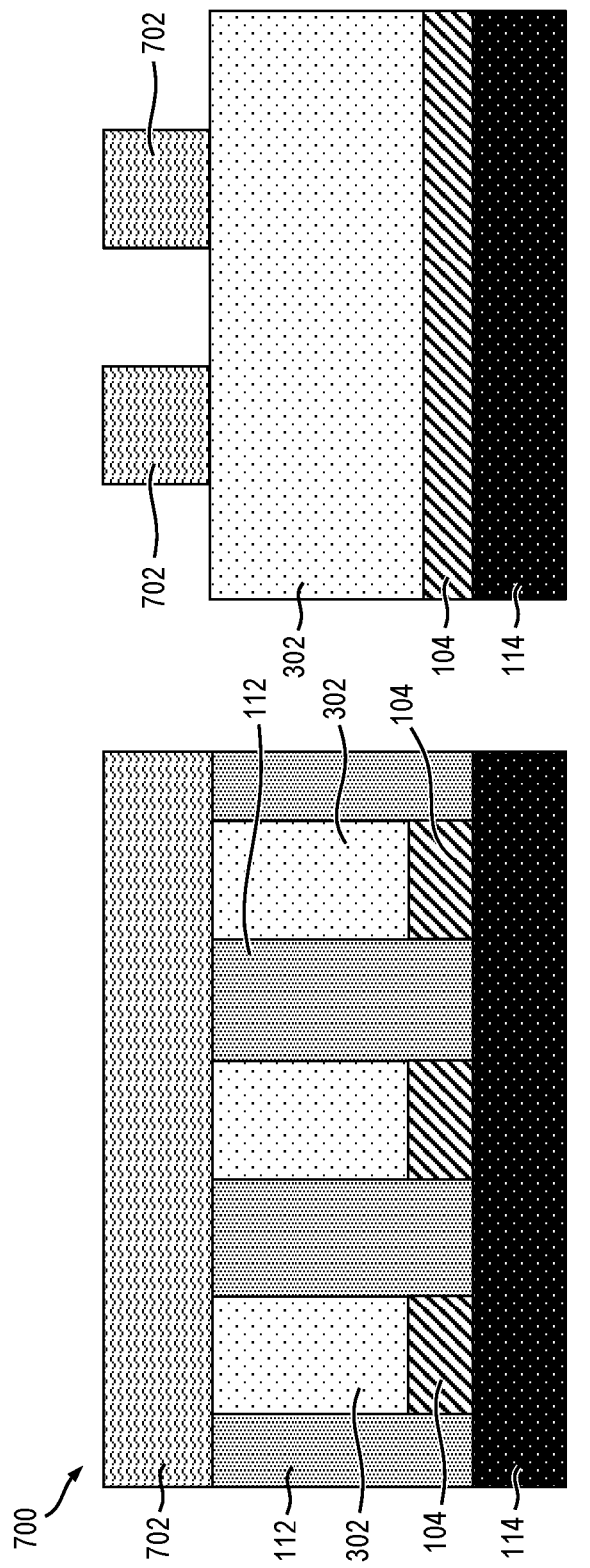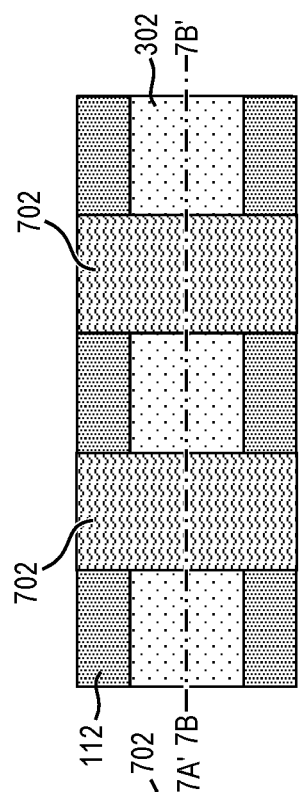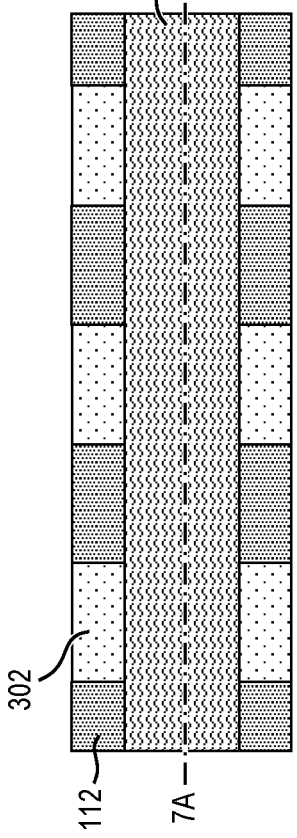

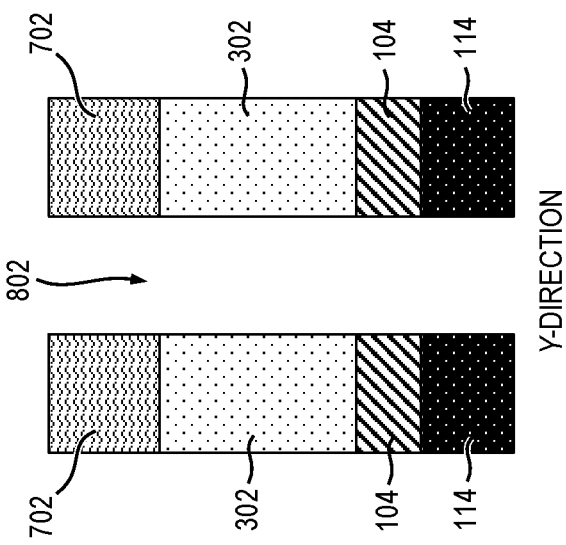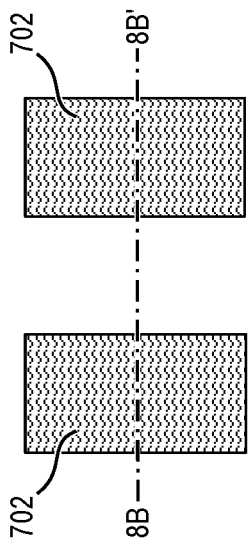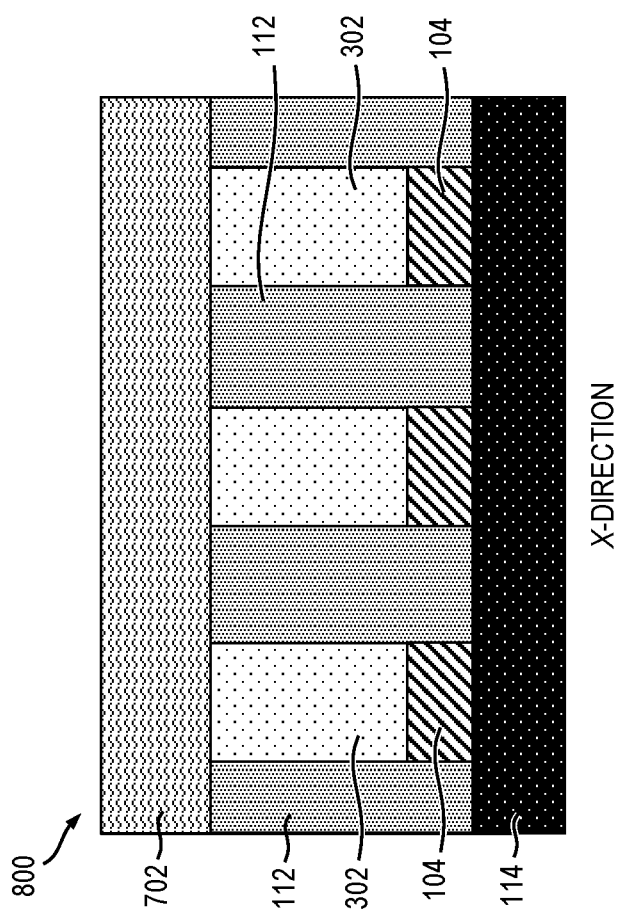

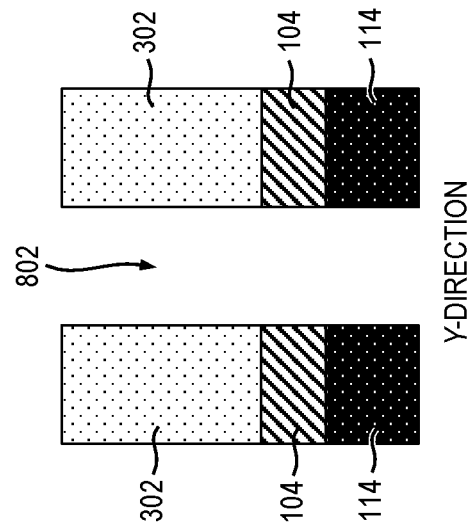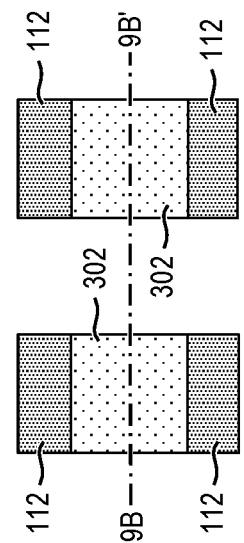
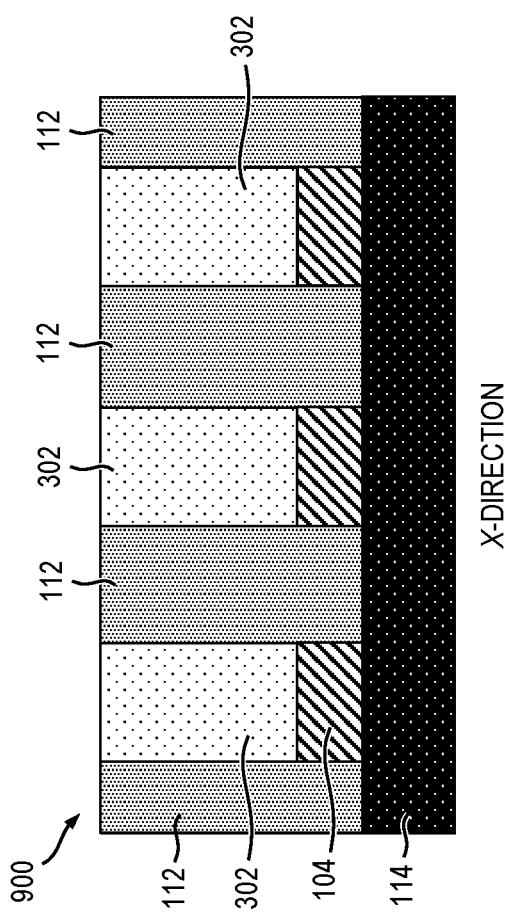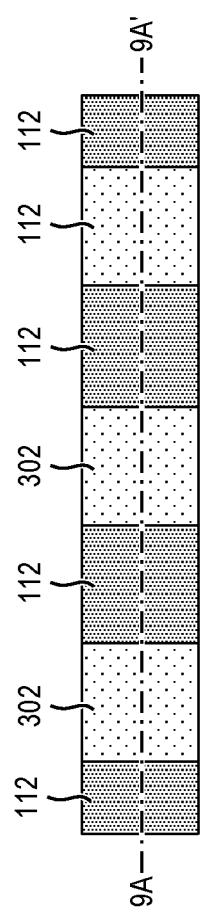

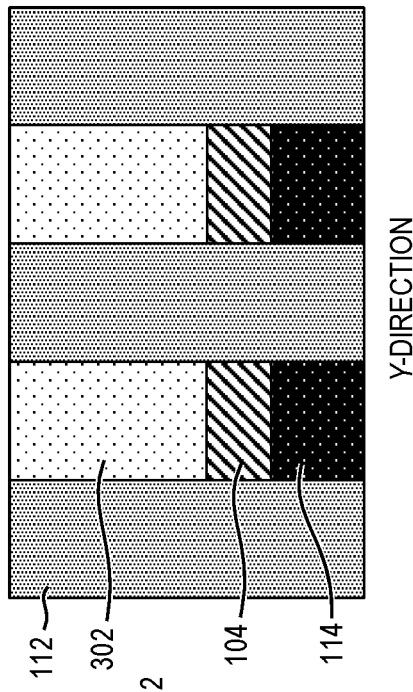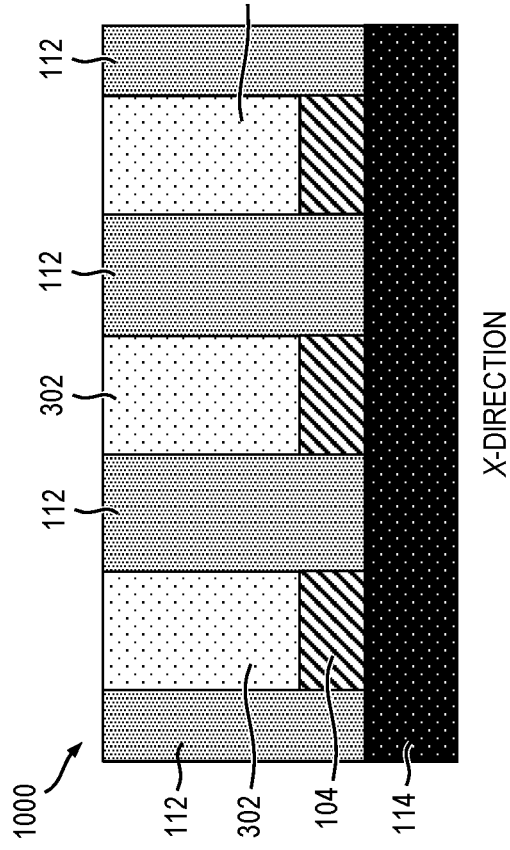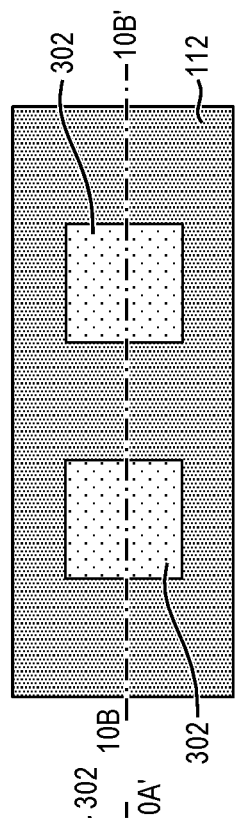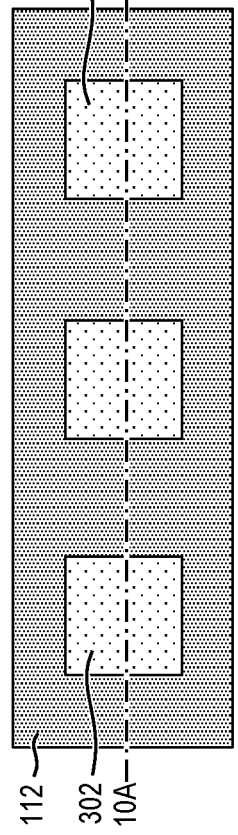

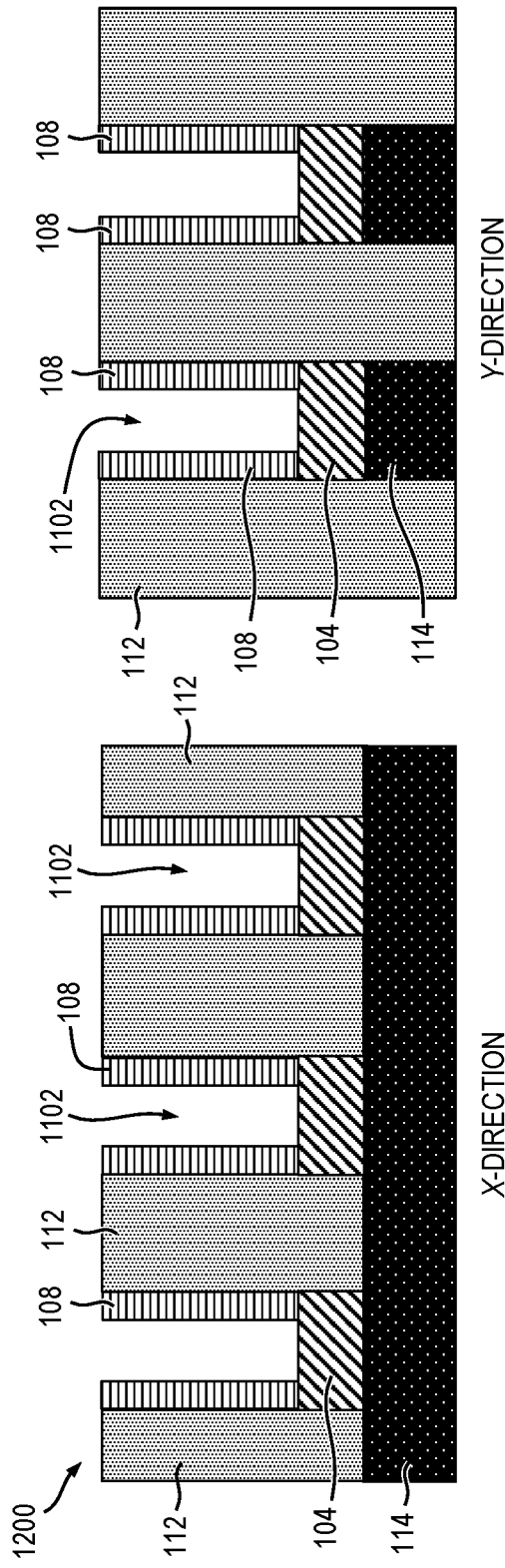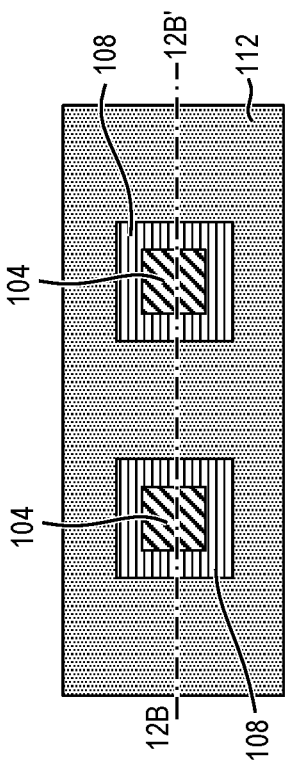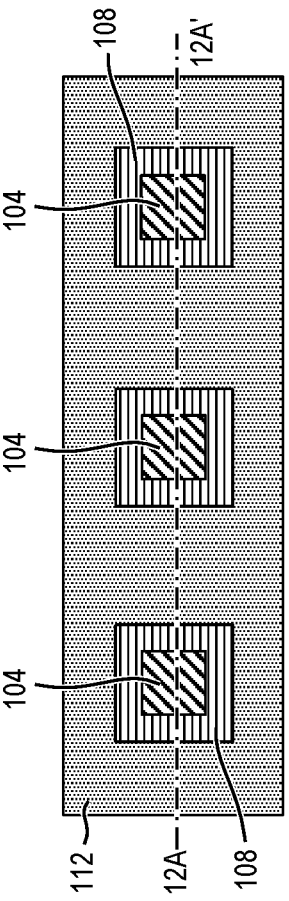

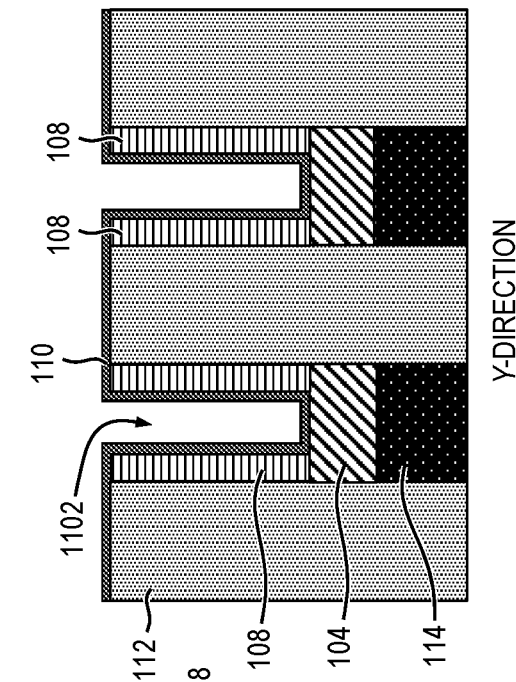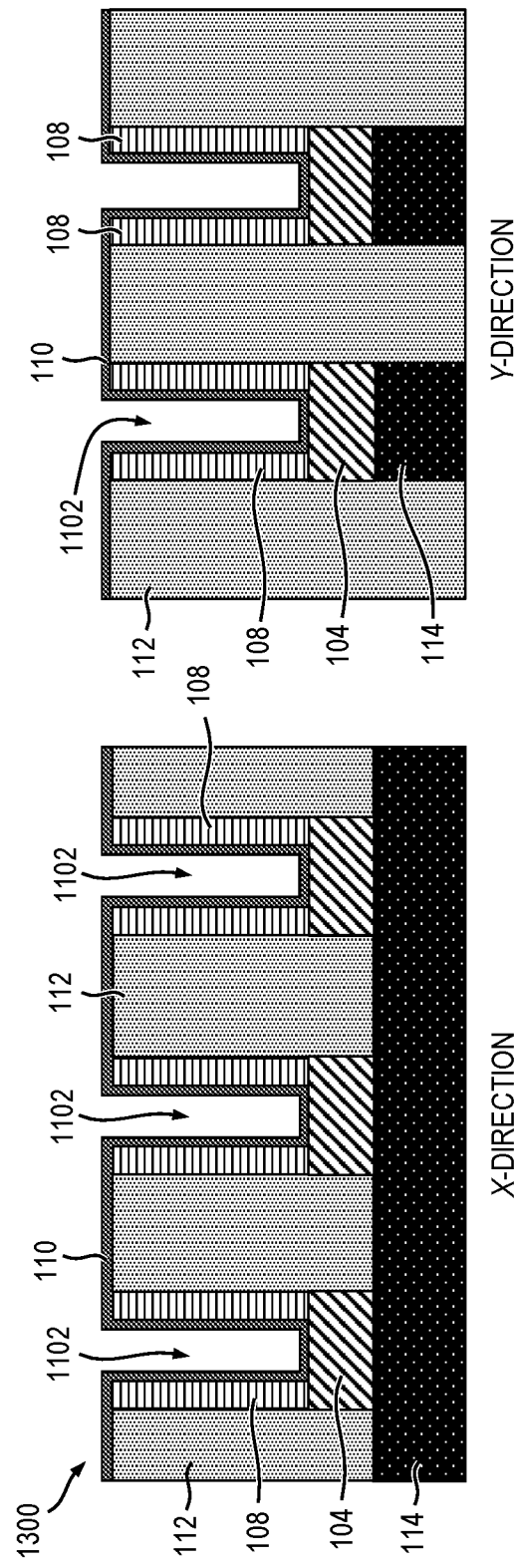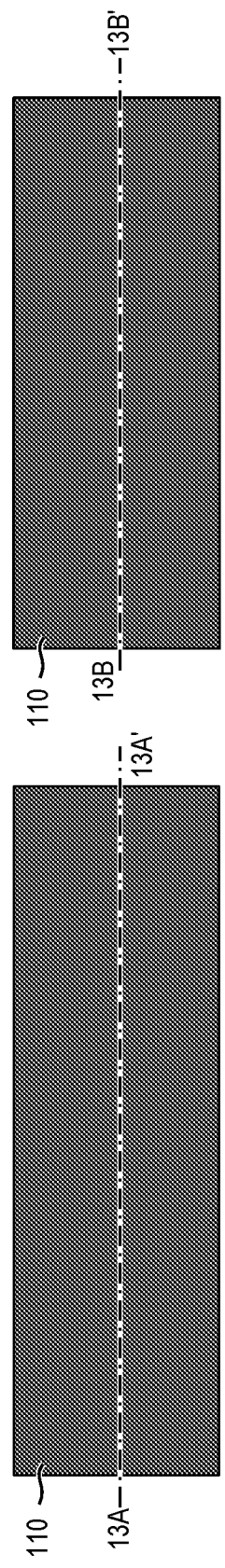

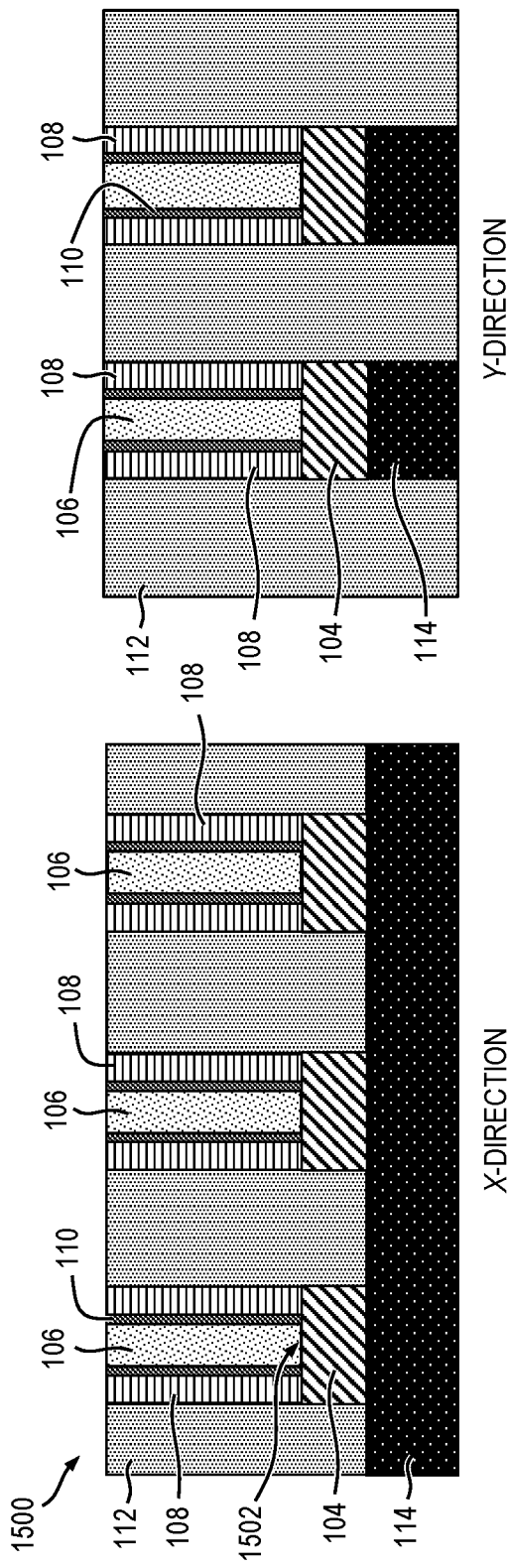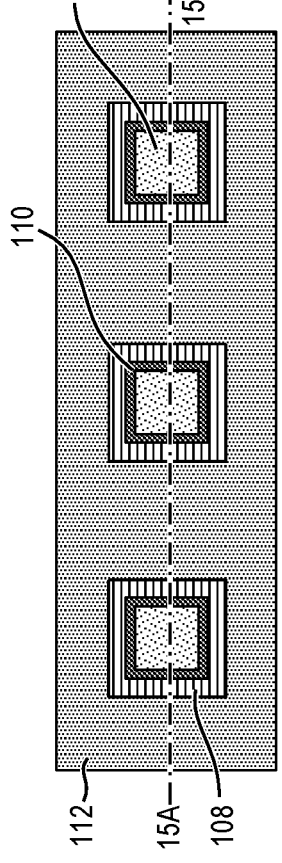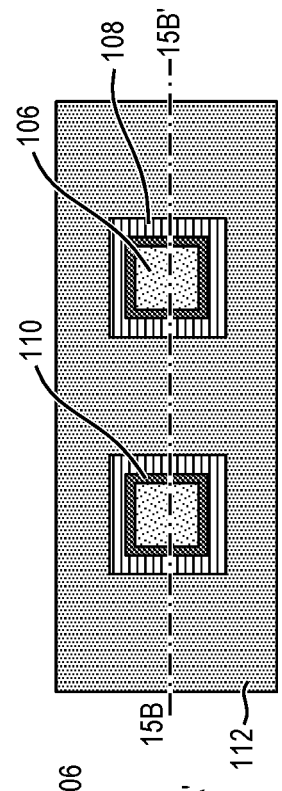

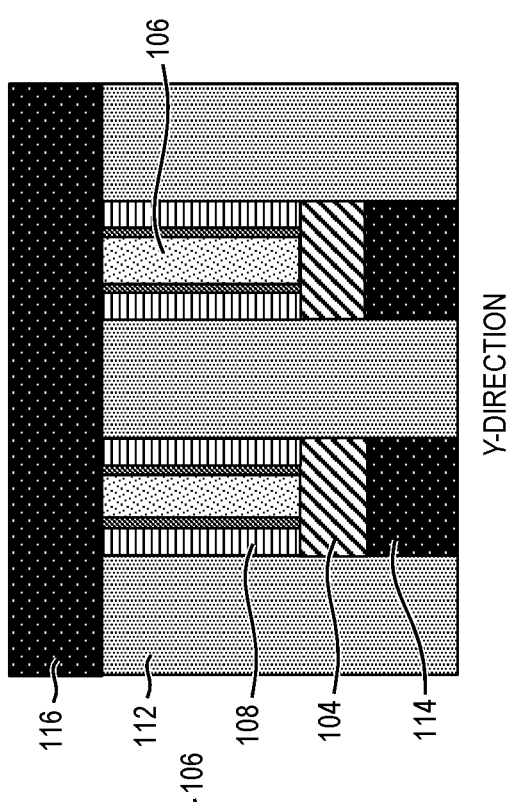
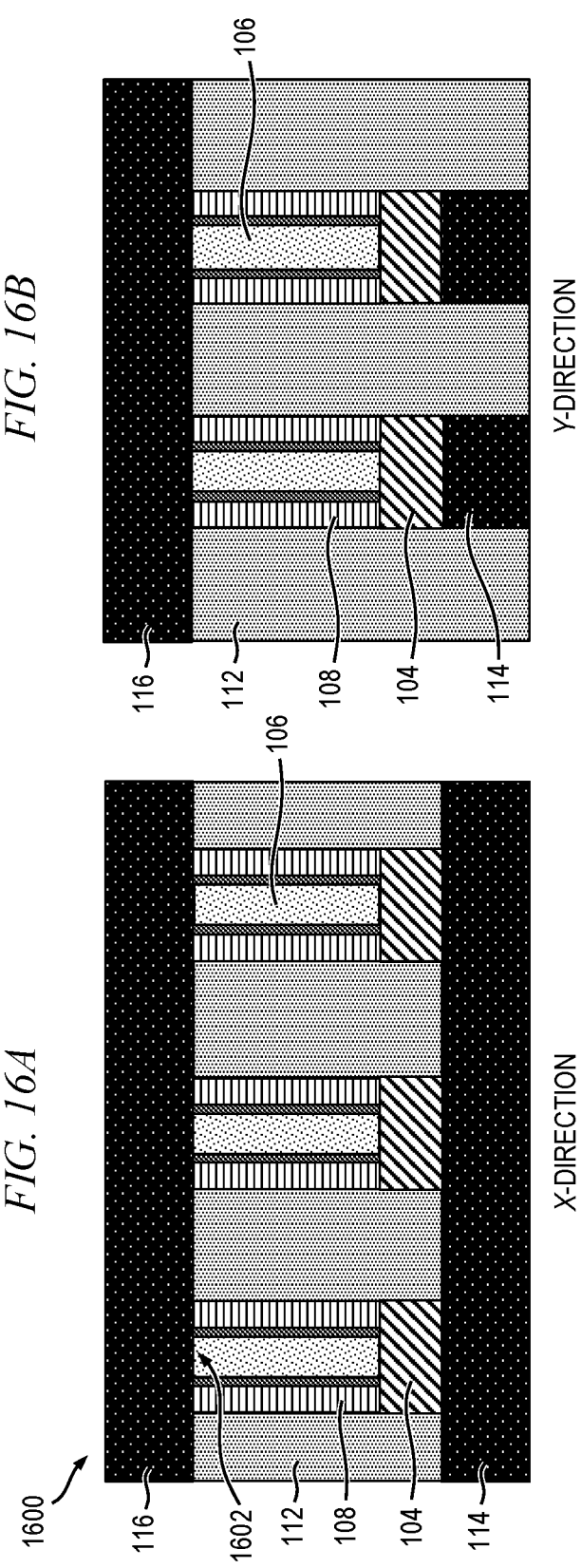
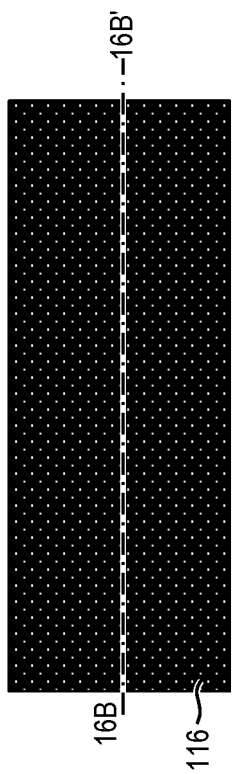
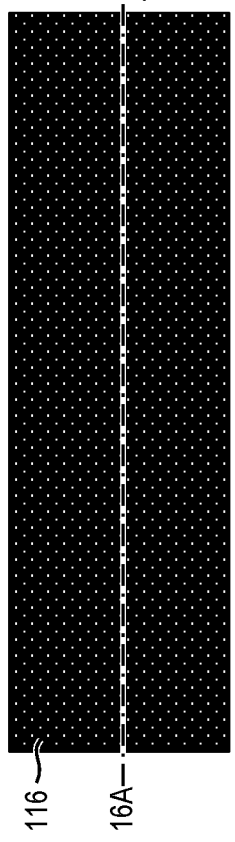

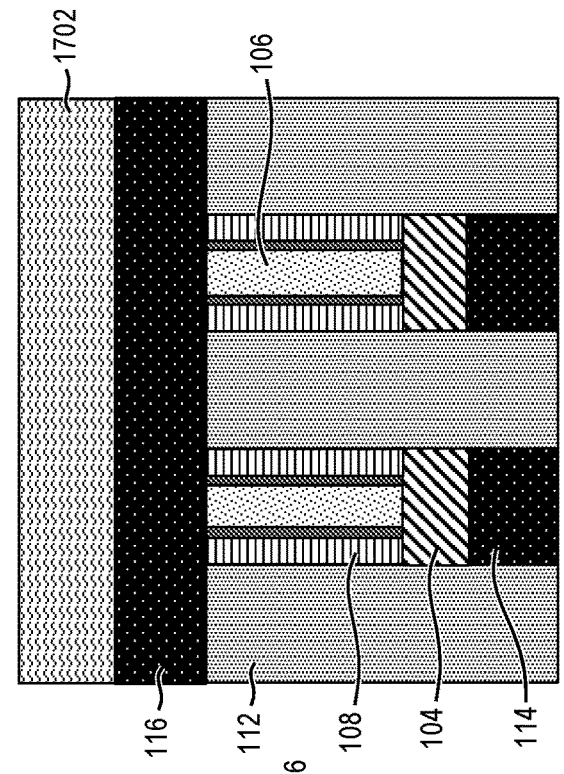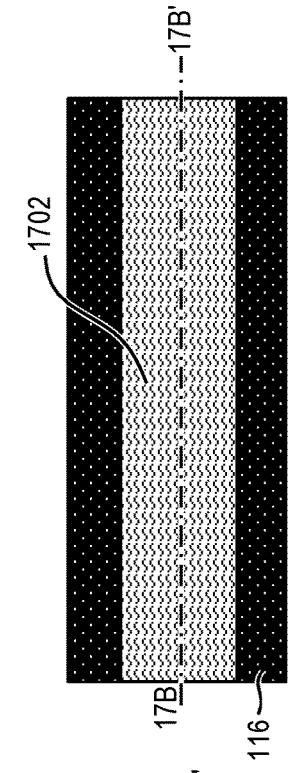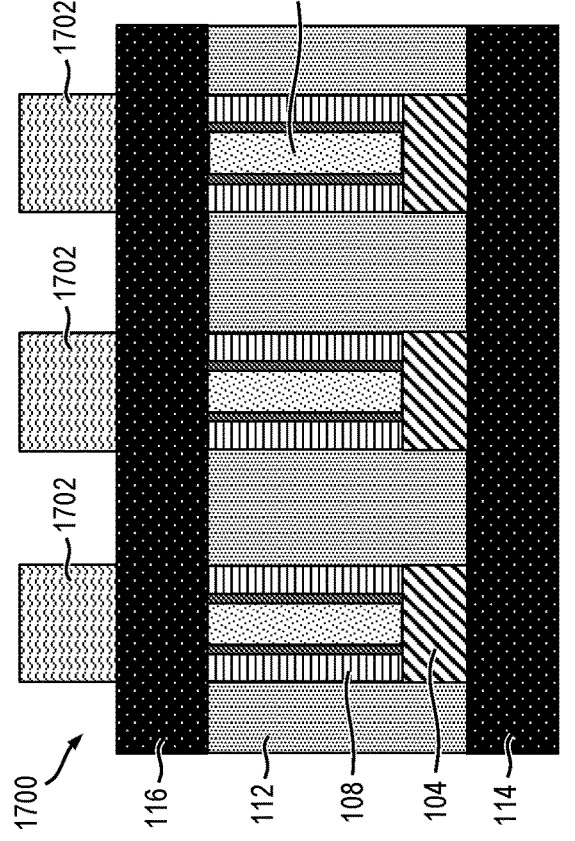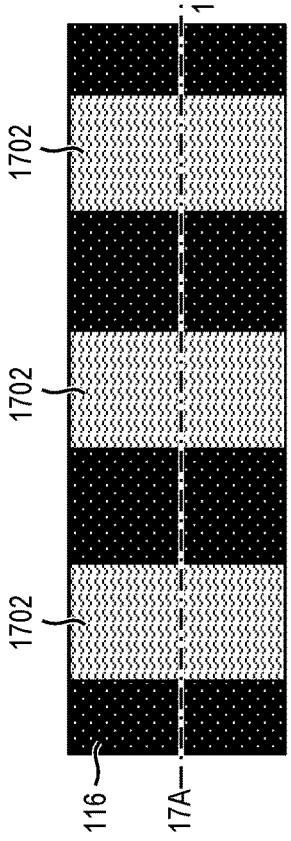

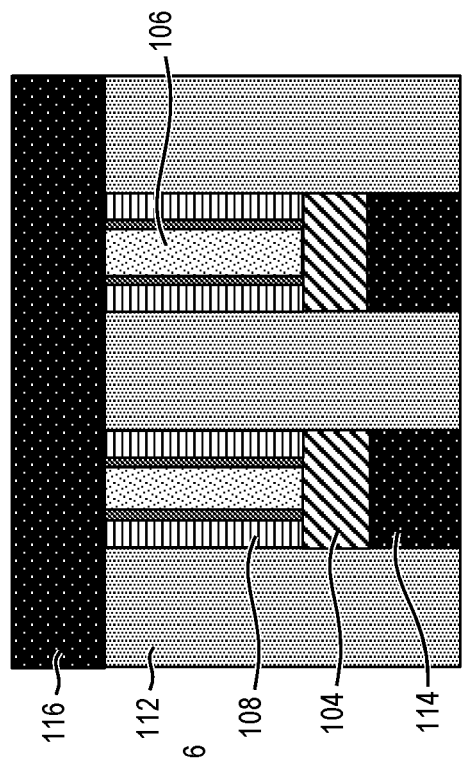
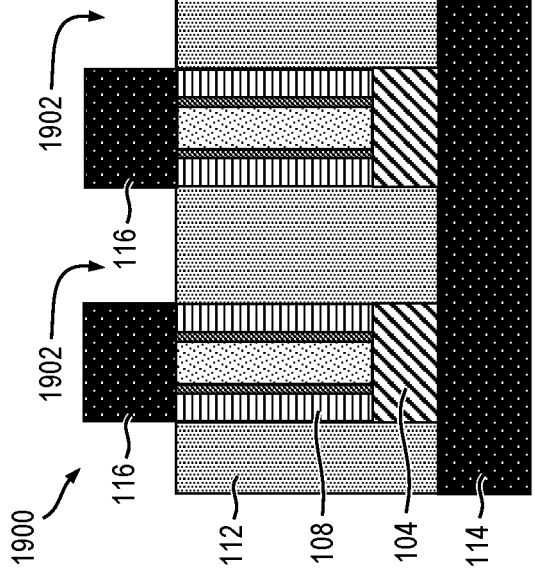
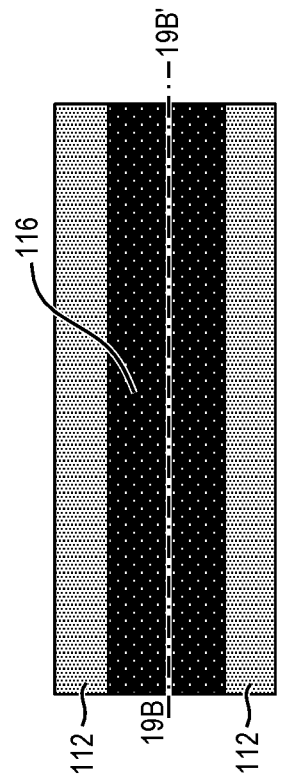
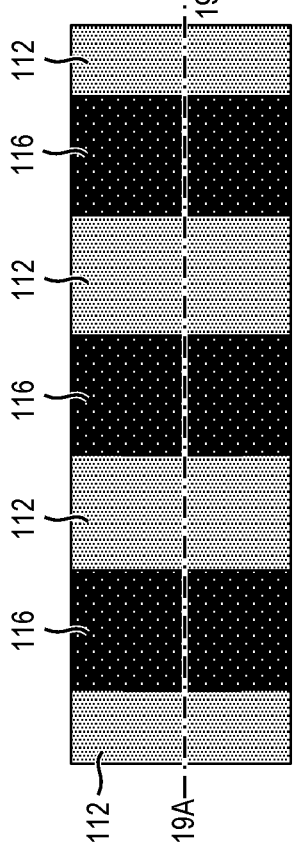

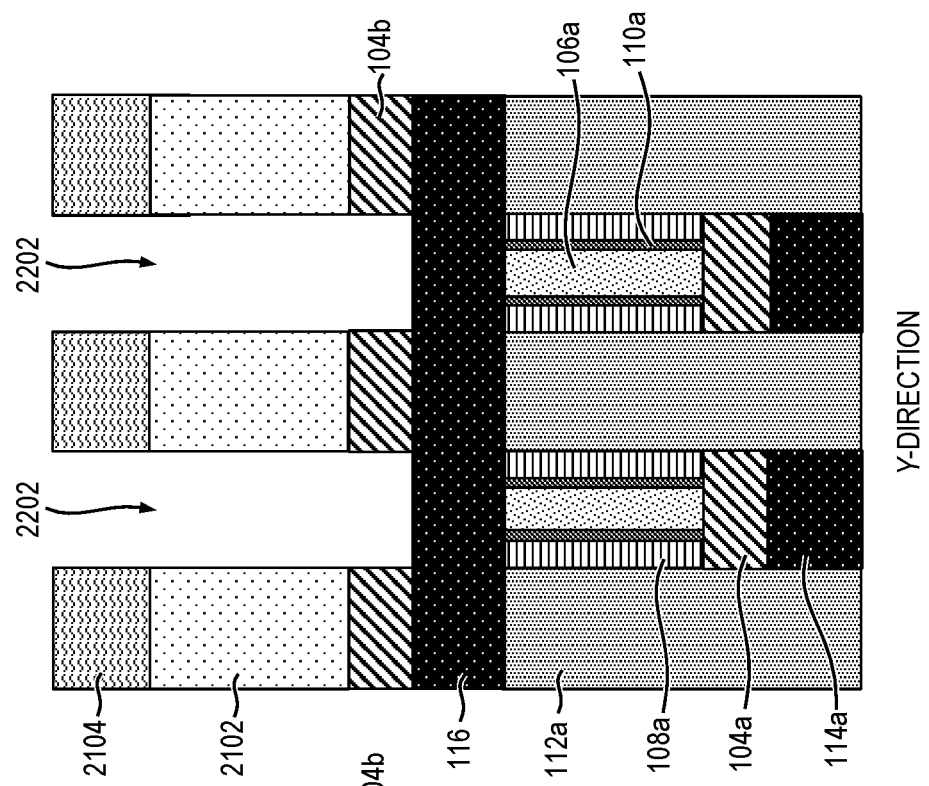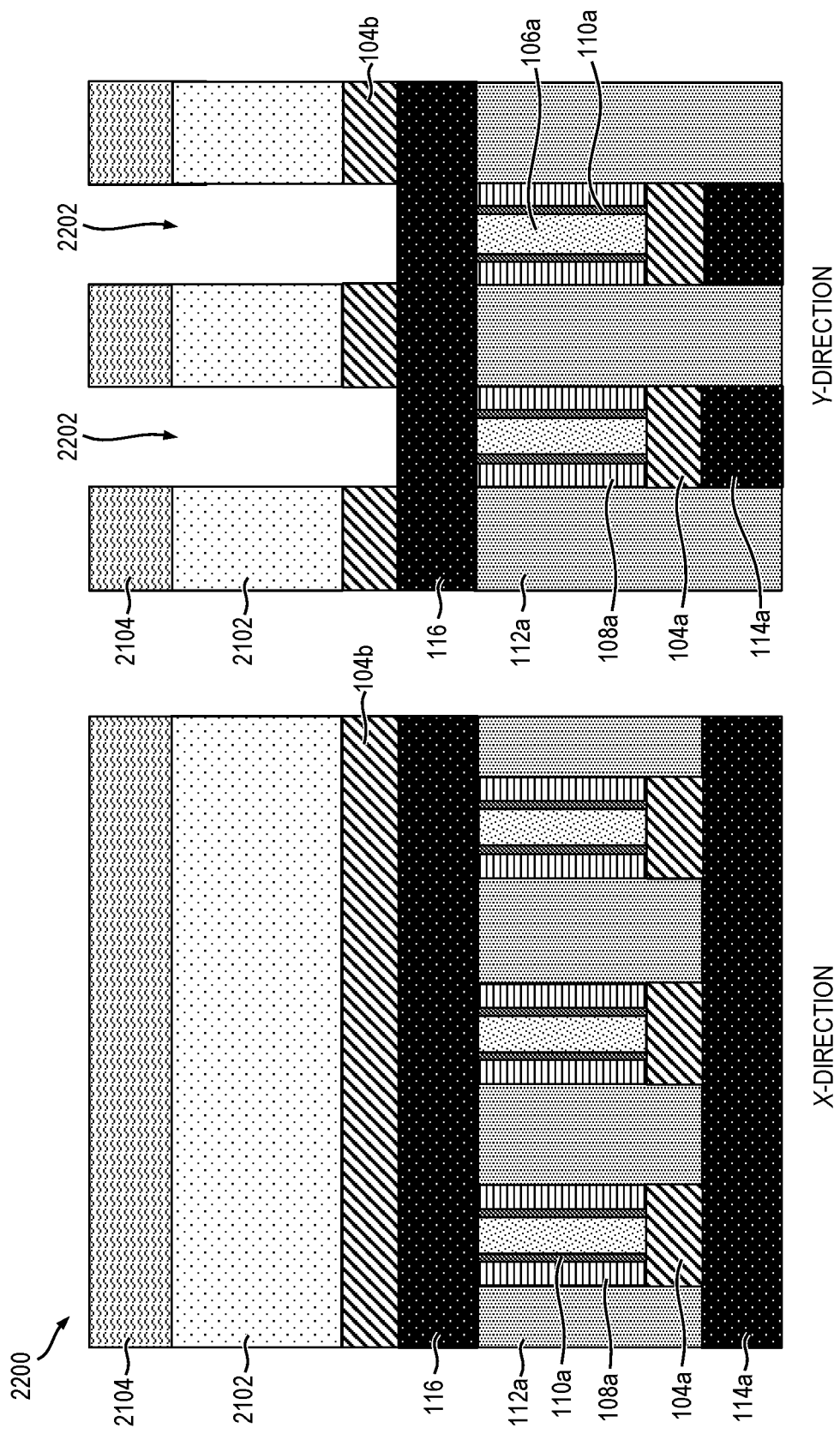

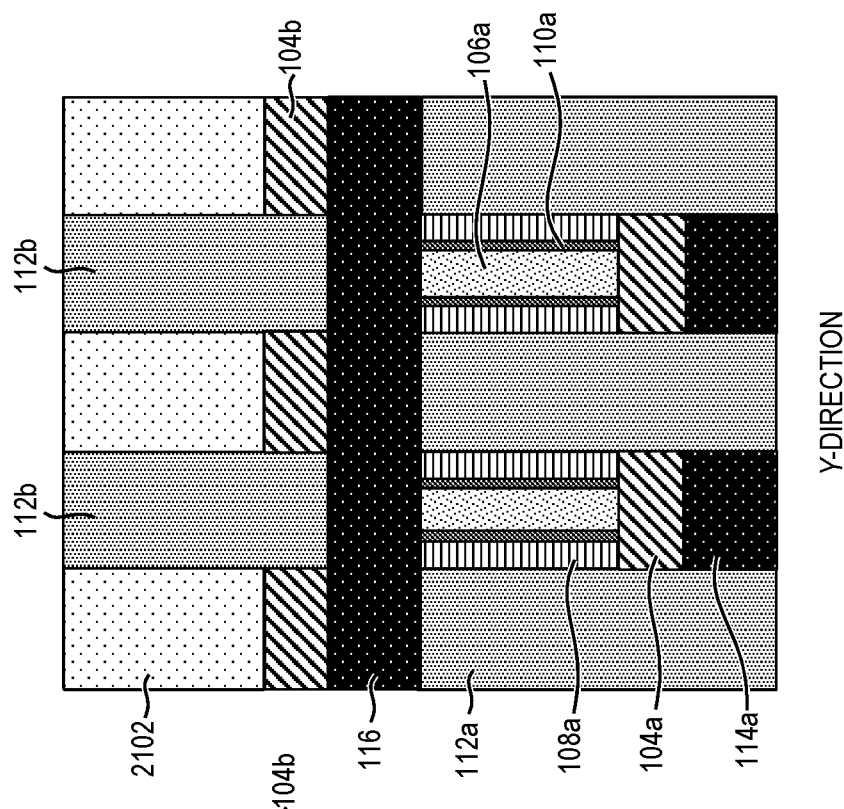
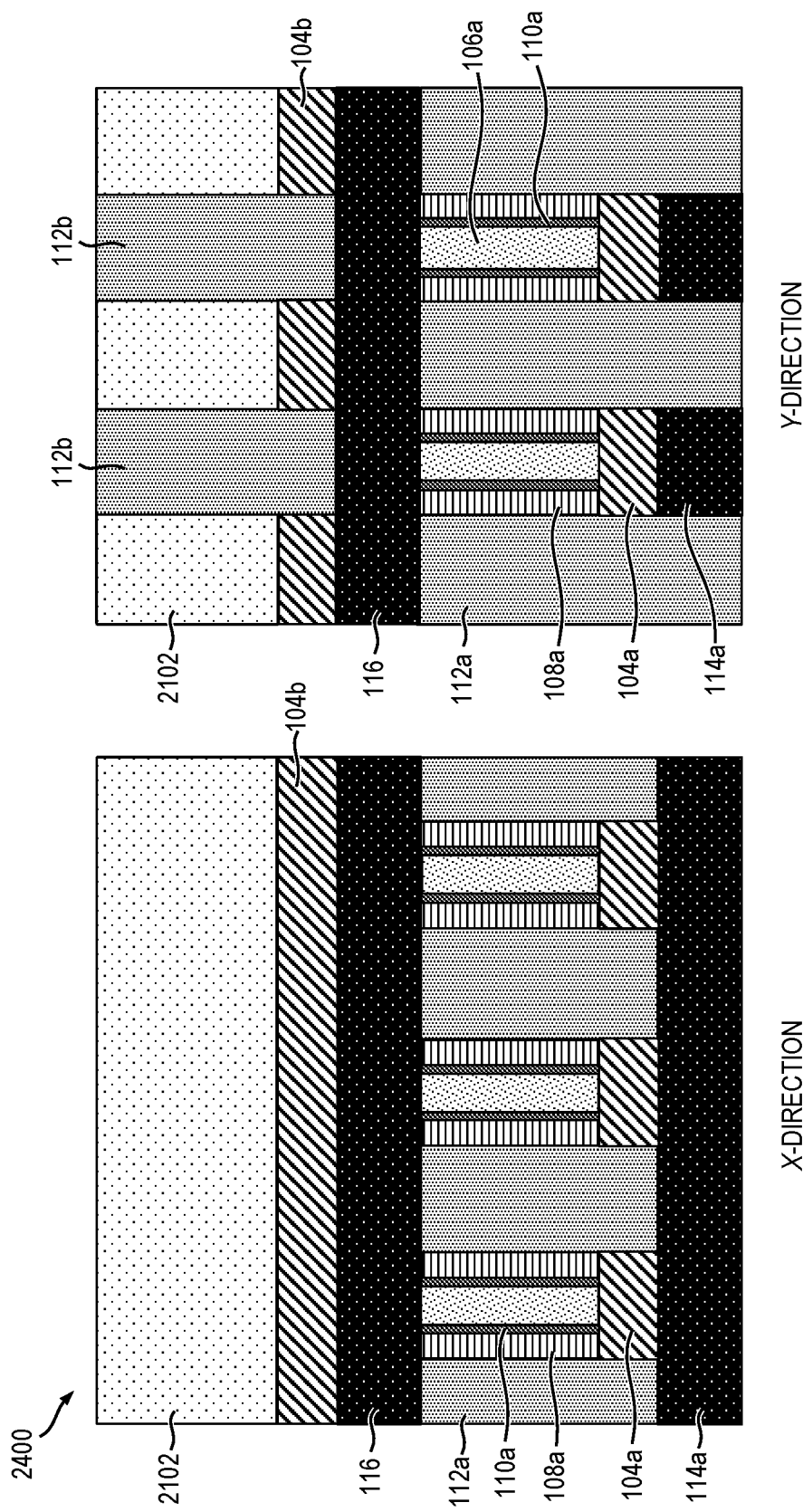

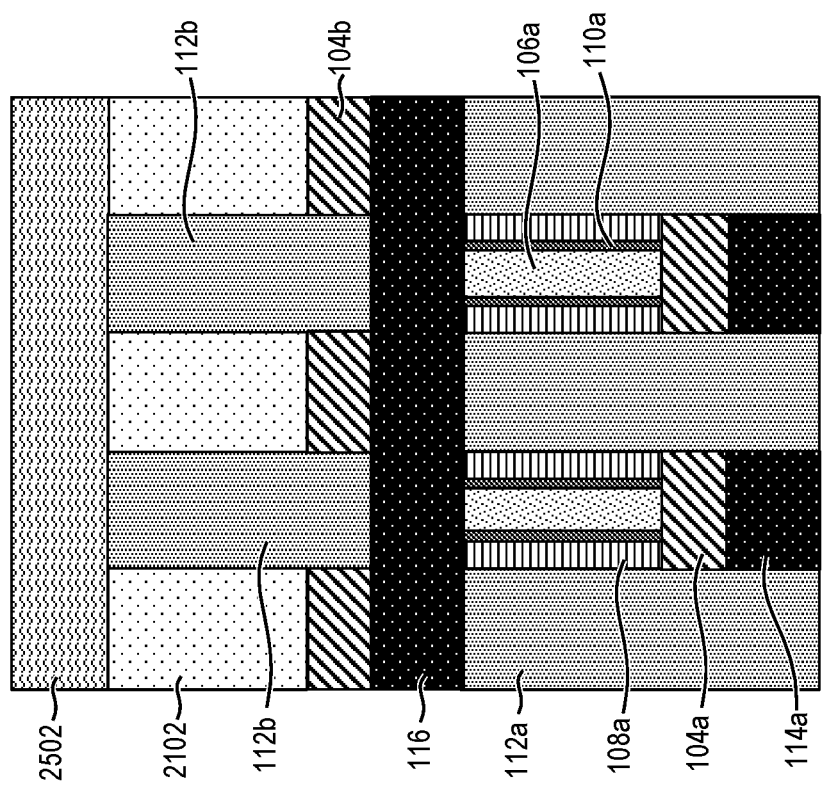
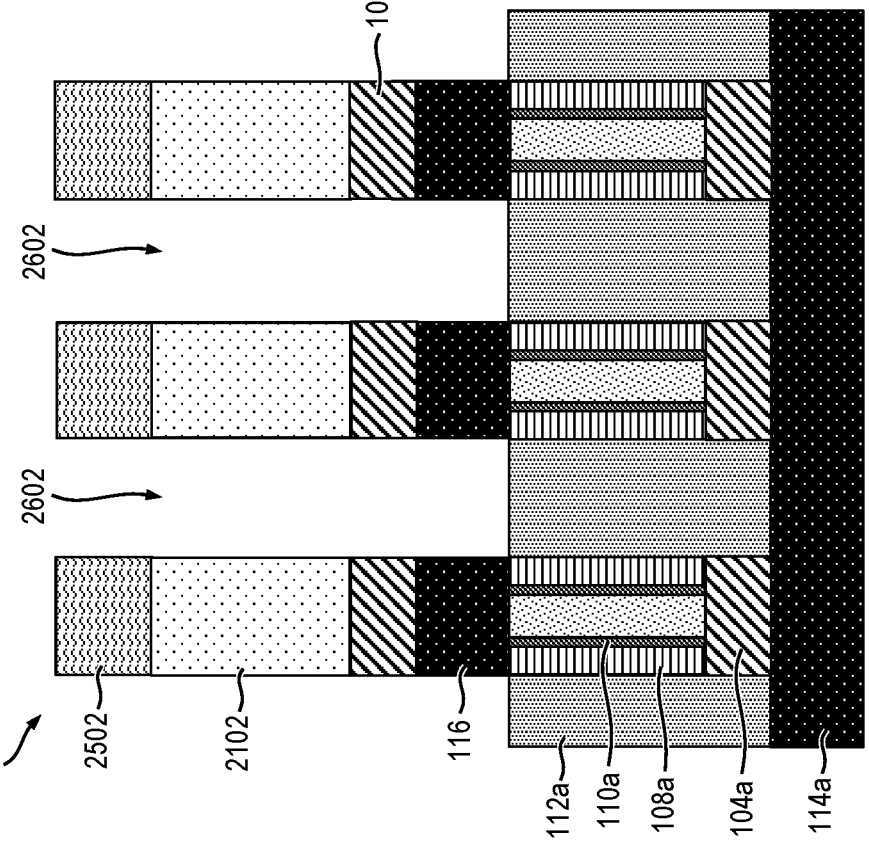

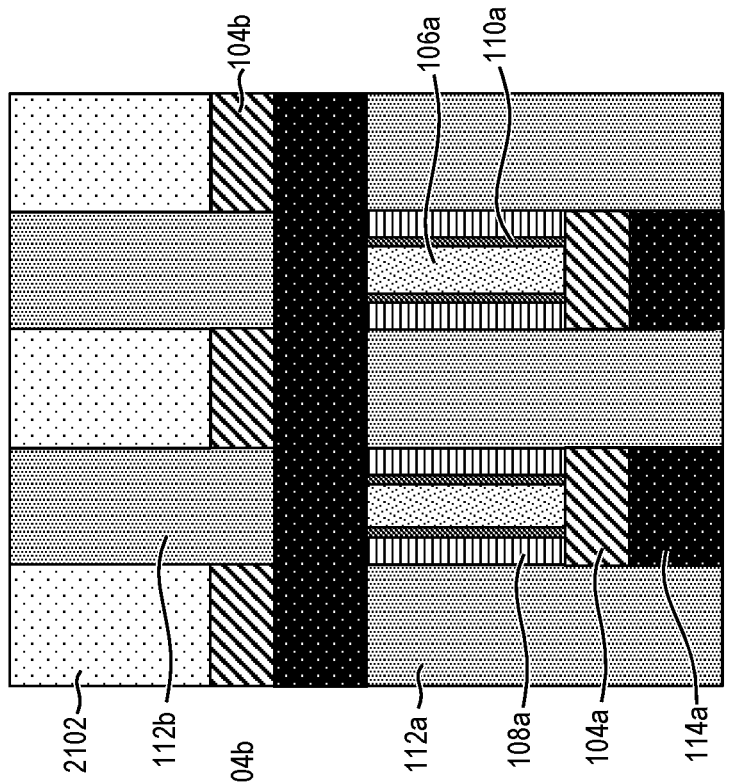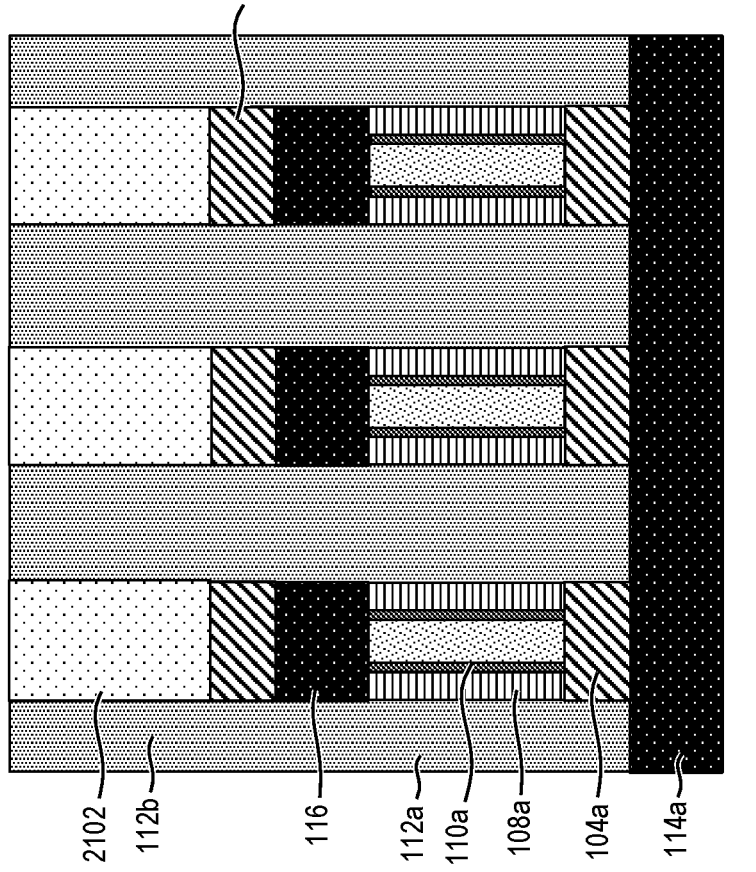

CROSSPOINT FILL-IN MEMORY CELL WITH ETCHED ACCESS DEVICE

CROSS-REFERENCE TO RELATED APPLICATION(S)

The present invention is a divisional of U.S. patent application Ser. No. 15/816,751, filed Nov. 17, 2017, having the same title and inventors as the present application, the disclosure of which is hereby incorporated by reference herein in its entirety for all purposes.

BACKGROUND

The present invention relates generally to the electrical, electronic and computer arts, and, more particularly, to memory devices and methods of forming such devices.

The maximal ideal density of a two-dimensional memory array is generally achieved with a 4F2 crosspoint array, where F is the minimum resolvable feature size, with a memory cell residing at each unique intersection of perpendicular wiring lines in the memory array. In order to form a crosspoint memory array for resistive memory (e.g., phase change memory (PCM) or resistive random-access memory (ReRAM or RRAM)), each memory element is typically comprised of a memory cell and an access device.

Although it is advantageous to fabricate the memory array with a minimal number of masking steps and processing steps, an adequate number of processing steps of certain types is conventionally required for forming a reliable memory cell. A single pattering using reactive ion etching (RIE) of the memory element and the access device would minimize the number of masking layers and processing steps, however it is often impossible or impractical to pattern the memory element using RIE without also damaging or in some way modifying the memory element during the RIE process.

SUMMARY

Aspects according to one or more embodiments of the present invention provide a crosspoint memory structure that incorporates a combination of a fill-in memory element with an etched (e.g., using reactive ion etching (RIE)) access device to achieve a minimal number of masking and processing steps compared to conventional fabrication methodologies. In one illustrative embodiment, a phase change memory (PCM) cell is fabricated without exposing the phase change material forming the PCM cell to the RIE chemistry by using an etched access device and a fill-in process flow within a sacrificial masking layer of the etched access device.

In accordance with an embodiment of the invention, an exemplary method of fabricating a memory array structure includes: forming at least one access device layer on an upper surface of a first conductive layer, the access device layer being in electrical connection with the first conductive layer; forming a sacrificial layer on an upper surface of the access device layer; etching the access device layer and the sacrificial layer using a same masking feature to form an access device that is self-aligned with a portion of the sacrificial layer; replacing a portion of the sacrificial layer with memory storage material to form a storage element, a first terminal of the storage element being in electrical connection with the access device; and forming a second conductive layer on an upper surface of the storage element, a second terminal of the storage element being in electrical connection with the second conductive layer.

In accordance with another embodiment of the invention, an exemplary semiconductor memory array structure includes first and second conductive layers, the first and second conductive layers being oriented orthogonally relative to one another. The memory array structure further includes at least one etched access device formed on an upper surface of the first conductive layer and at least one fill-in storage element formed on and self-aligned with the access device. The storage element includes memory storage material surrounded by a liner, the liner being at least partially conductive. The storage element has a first terminal which is electrically connected with the access device, the access device being devoid of the liner, and a second terminal which is electrically connected with the second conductive layer. Optionally, the liner is formed on sidewalls and a bottom to thereby define a volume in which to contain the memory storage material.

In one or more embodiments, a profile of the memory array structure, looking down from an upper surface of the structure, is configured having an inward taper, such that the storage element has a smaller diameter compared to the access device.

Techniques as disclosed herein can provide substantial beneficial technical effects. By way of example only and without limitation, one or more embodiments may provide one or more of the following advantages:

wiring levels are self-aligned to the access device and memory cell; a lower wiring level (word line) is patterned in conjunction with patterning of the access device and an upper wiring level (bit line) is patterned in conjunction with patterning of a top electrode of the PCM cell;

multiple layers of a crosspoint memory array structure in which the novel memory cell is utilized can be combined to form a three-dimensional memory architecture;

memory cells in the memory array structure according to embodiments of the invention are formed such that the phase change material is not exposed to an etching process (e.g., RIE);

The combination into a self-aligned structure of select-device materials which may typically only be deposited using PVD sputtering techniques with a phase change material which can typically only be deposited using an ALD-like or CVD-like fill-in phase change material.

The combination into a self-aligned structure of select-device materials which may typically only be deposited using PVD sputtering techniques with a phase change memory element which has cross-sectional dimensions not typically achievable with a RIE process of phase change materials due to RIE-induced damage or alteration or loss of the edge of the phase change materials, or due to the typical line etching process creating a non-sturdy line (due to the line width of the region containing the phase change material becoming small) of phase change memory element and select device.

The combination into a self-aligned structure of select-device of a single material type with a plurality of regions on a given chip with phase change devices of different phase change materials (using masking steps to sequentially expose different regions to different phase change material deposition processes).

Allowing the formation of the sacrificial material and the select-device material and electrodes using a RIE condition or chemistry which is tuned or optimized for the select device material (but which might be non-beneficial for exposed phase change material), or allowing for additional processing (e.g., wet cleans (e.g., $H_2O$-HF, or others), gas exposure (e.g., $N_2$, $O_2$, or other), anneal step (200 degrees Celsius anneal or other temperature)) post RIE of the sacrificial material and the select-device material and electrodes.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 1A-1D are corresponding views of at least a portion of an exemplary stackable single-layer crosspoint memory array structure, according to an embodiment of the invention; FIG. 1A is a cross-sectional view of the memory array structure in a first direction (x-direction) taken along line 1A-1A' of FIG. 1C, FIG. 1B is a cross-sectional view of the memory array structure in a second direction (y-direction), orthogonal to the first direction, taken along line 1B-1B' of FIG. 1D, FIG. 1C is a top plan view of the memory array structure in the first direction, and FIG. 1D is a top plan of the memory array structure in the second direction;

FIG. 2A is a cross-sectional view of the memory array structure in a first direction (x-direction) and FIG. 2B is a cross-sectional view of the memory array structure in a second direction (y-direction), orthogonal to the first direction;

FIGS. 3A-3D, 4A-4D, 5A-5D, 6A-6D, 7A-7D, 8A-8D, 9A-9D, 10A-10D, 11A-11D, 12A-12D, 13A-13D, 14A-14D, 15A-15D, 16A-16D, 17A-17D, 18A-18D, 19A-19D and 20A-20D depict an illustrative process flow of the PCM embodiment of a stackable single-layer crosspoint memory array structure shown in FIGS. 1A-1D, according to one or more embodiments of the present invention; and FIGS. 21A, 21B, 22A, 22B, 23A, 23B, 24A, 24B, 25A, 25B, 26A, 26B, 27A, 27B, 28A and 28B depict an illustrative process flow for fabricating the stackable double-layer crosspoint PCM memory array structure shown in FIGS. 2A and 2B, according to one or more embodiments of the present invention.

Figure 2B:
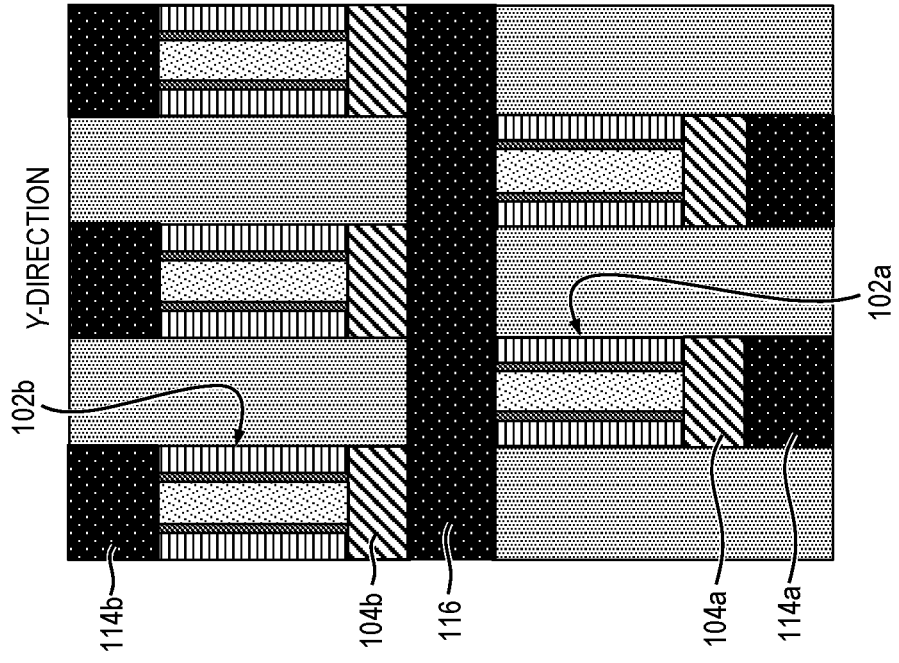
FIGS. 2A and 2B are corresponding views of at least a portion of an exemplary stackable double-layer crosspoint memory array structure with shared wiring layer, according to an embodiment of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative crosspoint memory structures and methods for fabricating such memory structures. It is to be appreciated, however, that the specific structures and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Although the overall fabrication method and the structures for the disclosed embodiments are entirely novel, certain individual processing steps required to implement the structure and/or circuitry may utilize conventional semiconductor fabrication techniques and conventional semiconductor fabrication tooling. These techniques and tooling will already be familiar to one having ordinary skill in the relevant art given the teachings herein. Moreover, many of the processing steps and tooling used to fabricate semiconductor devices are also described in a number of readily available publications, including, for example: James D. Plummer et al., *Silicon VLSI Technology*, Prentice Hall; 2 edition (Nov. 11, 2008); and James D. Plummer et al., *Silicon VLSI Technology: Fundamentals, Practice, and Modeling*, Pearson; 1 edition (Jul. 24, 2000), both of which are hereby incorporated by reference herein in their entireties. It is emphasized that while some individual processing steps may be set forth herein, those steps are merely illustrative, and one skilled in the art may be familiar with several equally suitable alternatives that would also fall within the scope of the invention.

It is to be appreciated that the various layers, regions and/or components shown in the accompanying figures may not be drawn to scale. Furthermore, one or more semiconductor layers of a type commonly used in such integrated circuit structures may not be explicitly shown in a given figure for economy of description. This does not imply, however, that the semiconductor layer(s) not explicitly shown are omitted in the actual integrated circuit structure.

It is generally beneficial to fabricate a memory structure with a minimal number of masking and processing steps, since each additional fabrication step not only adds to the overall cost of the structure but also increases the likelihood of impurities or other errors being introduced into the process, which in turn reduces yield and/or reliability. That said, an adequate number of processing steps of certain types is conventionally required for forming a reliable memory cell. In forming a memory cell, a single patterning using reactive ion etching (RIE) of the memory element and the access device in the cell would minimize the number of masking layers and processing steps, however it is conventionally impossible or impractical to pattern the memory element using RIE without also damaging or in some way modifying the memory element during the RIE process.

Embodiments of the invention provide a crosspoint memory structure that maintains a minimal number of masking and processing steps by beneficially incorporating a combination of a fill-in memory element with an etched (e.g., using RIE) access device. In one or more embodiments, a crosspoint memory array structure includes a plurality of phase change memory (PCM) cells fabricated without exposing the phase change material to the RIE chemistry using a fill-in process flow within a sacrificial masking layer of the etched access device. In one or more embodiments, wiring levels in the memory structure are self-aligned to the access device and memory cell; a lower wiring level (word line) is patterned in conjunction with the patterning of the access device and an upper wiring level (bit line) is patterned in conjunction with the patterning of a top electrode of the PCM cell. Multiple layers of the crosspoint memory array structure can be combined to form a three-dimensional (3D) memory architecture.

FIGS. 1A-1D are corresponding views of at least a portion of an exemplary stackable single-layer crosspoint memory array structure 100, according to an embodiment of the invention; FIG. 1A is a cross-sectional view of the memory array structure in a first direction (x-direction) taken along line 1A-1A' of FIG. 1C, FIG. 1B is a cross-sectional view of the memory array structure in a second direction (y-direction), orthogonal to the first direction, taken along line 1B-1B' of FIG. 1D, FIG. 1C is a top plan view of the memory array structure in the first direction, and FIG. 1D is a top plan of the memory array structure in the second direction.

With reference to FIGS. 1A-1D, the illustrative memory array structure 100 includes a plurality of fill-in memory cells, each memory cell including a PCM storage element 102 formed on, and self-aligned with, an etched access device 104 in a 4F2 crosspoint array, where F is the minimum resolvable feature size. The PCM storage element 102, in this embodiment, comprises a phase change material layer 106 surrounded by a dielectric collar 108, which may be formed of, for example, silicon nitride (SiN) or another suitable material. The phase change material layer 106, in one or more embodiments, comprises GeSbTe (germanium-antimony-tellurium or GST) but can be any phase change material, as will be known to those skilled in the art. It is to be appreciated, however, that the storage element 102, in other embodiments, can be formed of something other than phase change material, such as, but not limited to, hafnium oxide ($HfO_2$) with a titanium buffer layer, binary transition metal oxides (e.g., NiO or $TiO_2$), solid-state electrolytes (e.g., germanium sulfide, germanium selenide, $SiO_x$, copper sulfide, etc.), organic charge-transfer complexes (e.g., CuTCNQ), perovskites (e.g., $Sr(Zr)TiO_3$ or PCMO), two-dimensional insulating materials (e.g., hexagonal boron nitride), and the like, in the case of a resistive random access memory storage element.

The memory cells in the memory array structure 100 are isolated from one another (both electrically and thermally) by an insulating layer 112 formed between adjacent memory cells. The insulting layer 112 may comprise, for example, silicon dioxide ($SiO_2$), silicon nitride ($Si_3N_4$), or another insulator with low thermal conductivity.

A liner 110 is preferably disposed between the dielectric collar 108 and the phase change material layer 106. The liner 110, in one or more embodiments, comprises a metal nitride layer (e.g., tantalum nitride (TaN), titanium nitride (TiN), tantalum silicon nitride (TaSiN), tantalum aluminum nitride (TaAlN), titanium aluminum nitride (TiAlN), titanium silicon nitride (TiSiN), etc.) and functions, at least in part, as a resistance drift stabilizer during operation of the memory, and to prevent phase change material 106 from diffusing into the dielectric collar 108 during subsequent processing or during programming of the memory.

The access device 104 can be any etched two-terminal device, such as, for example, a polysilicon diode, mixed ionic electronic conductor (MIEC) device, ovonic threshold switch (OTS), or the like. Although specific details of the access device 104 are omitted in the figures, it is to be understood that the access device implicitly includes access device material (i.e., selector material) as well as top and bottom electrodes and, optionally, additional interface layers for providing electrical connection with the access device material.

The memory array structure 100 further includes a first conductive wiring layer, which may be used to form word lines 114, and a second conductive wiring layer, which may be used to form bit lines 116. The first and second wiring layers are comprised of conductive metal materials (e.g., tungsten (W), titanium (Ti), tantalum (Ta), Copper (Cu), TiN, TaN, etc.); the first and second wiring layers need not be comprised of the same materials. Preferably, the word lines 114 and bit lines 116 are arranged orthogonal to one another, although embodiments of the invention are not limited to any specific orientation of the word lines and bit lines. A first electrode of each access device 104 in a given memory cell is connected to a corresponding one of the word lines 114, a second electrode of the access device is connected to a first terminal of a corresponding storage element 102 in the given memory cell, and a second terminal of the storage element is connected with a corresponding one of the bit lines 116. Additional novel features of the memory cell, in one or more embodiments, include a fully-confined phase change material 106 with a partially conductive or highly resistive metal nitride layer 110.

Figure 2A:
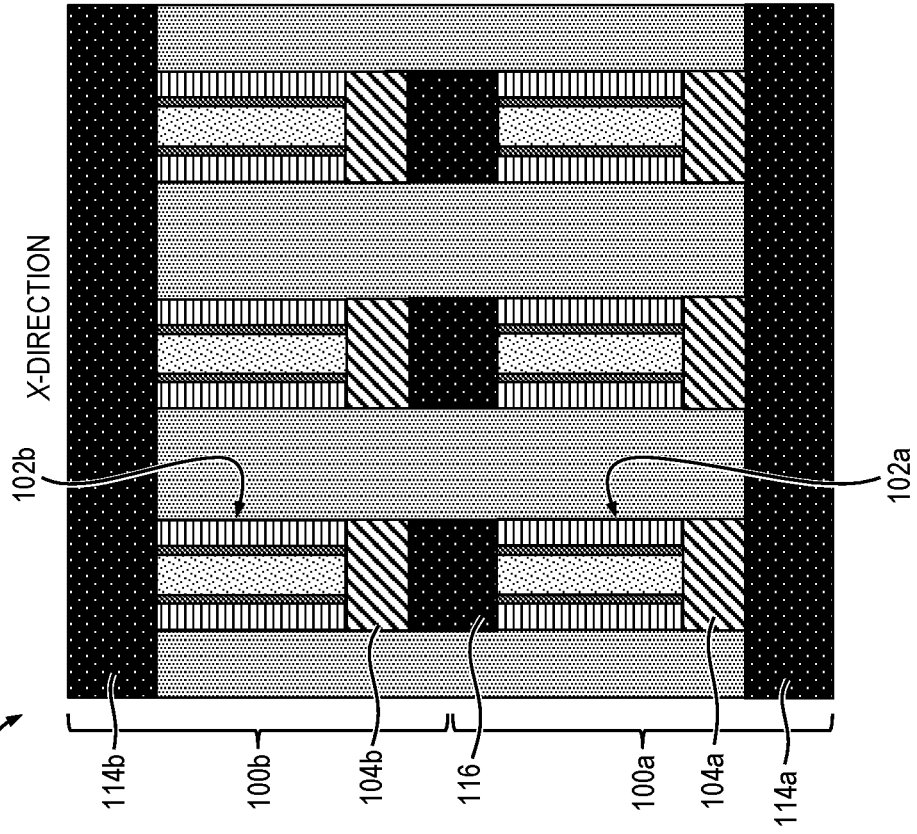

FIGS. 2A and 2B are corresponding views of at least a portion of an exemplary stackable double-layer crosspoint memory array structure 200 with shared wiring layer, according to an embodiment of the invention; FIG. 2A is a cross-sectional view of the memory array structure in a first direction (x-direction) and FIG. 2B is a cross-sectional view of the memory array structure in a second direction (y-direction), orthogonal to the first direction. With reference to FIGS. 2A and 2B, the illustrative memory array structure 200 essentially comprises two illustrative memory array structures stacked on one another so as to share common bit lines 116.

Specifically, the double-layer crosspoint memory array structure 200 includes first and second single-layer crosspoint memory array structures, 100a and 100b, respectively, each formed in a manner consistent with the illustrative memory array structure 100 shown in FIGS. 1A-1D. Each of the memory array structures 100a, 100b includes a plurality of fill-in memory cells, each memory cell including a PCM storage element 102a, 102b formed on a corresponding etched access device 104a, 104b in a 4F2 crosspoint array, where F is the minimum resolvable feature size. The PCM storage element 102a, 102b, and corresponding access device 104a, 104b, in this embodiment, may be formed in a manner consistent with the storage element 102 and corresponding access device 104, respectively, shown in FIGS. 1A-1D. The second memory array structure 100b is flipped upside down relative to the first memory array structure 100a in a mirrored configuration, so that corresponding bit lines 116 are shared between vertically adjacent memory cells, as shown.

As previously stated, aspects according to one or more embodiments of the present invention beneficially provide a crosspoint memory structure that incorporates a combination of a fill-in memory element with an etched access device (e.g., using RIE) to achieve a minimal number of masking and processing steps compared to conventional fabrication methodologies. Furthermore, in one or more embodiments, a PCM cell is fabricated without exposing the phase change material to the RIE chemistry by using an etched access device and a fill-in process flow within a sacrificial masking layer of the etched access device. By way of example only and without limitation, a description of an illustrative process flow of the PCM embodiment of a stackable single-layer crosspoint memory array structure according to one or more embodiments of the invention will be described in conjunction with FIGS. 3A-3D, 4A-4D, 5A-5D, 6A-6D, 7A-7D, 8A-8D, 9A-9D, 10A-10D, 11A-11D, 12A-12D, 13A-13D, 14A-14D, 15A-15D, 16A-16D, 17A-17D, 18A-18D, 19A-19D and 20A-20D.

Figure 3B:
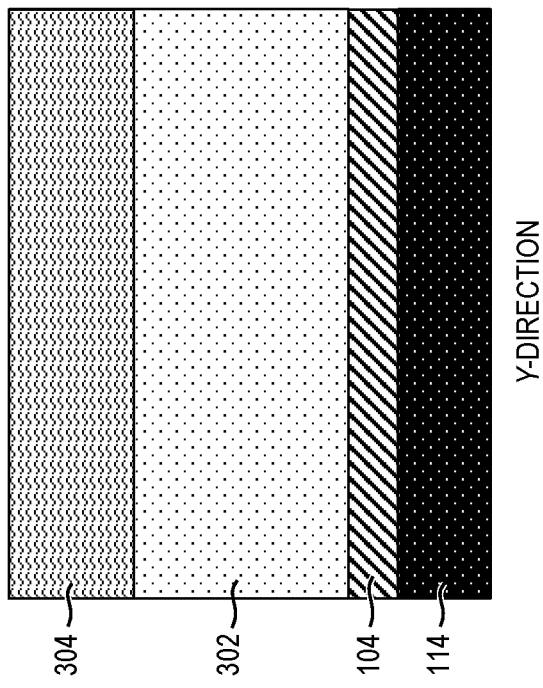
Figure 3D:
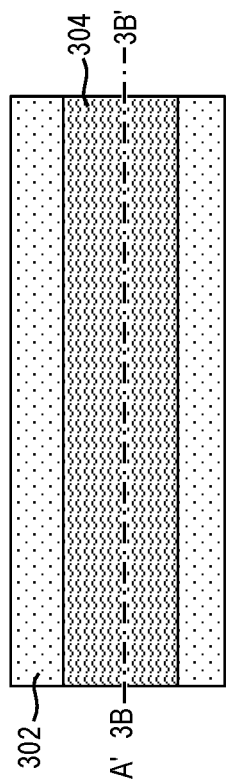
Figure 3A:
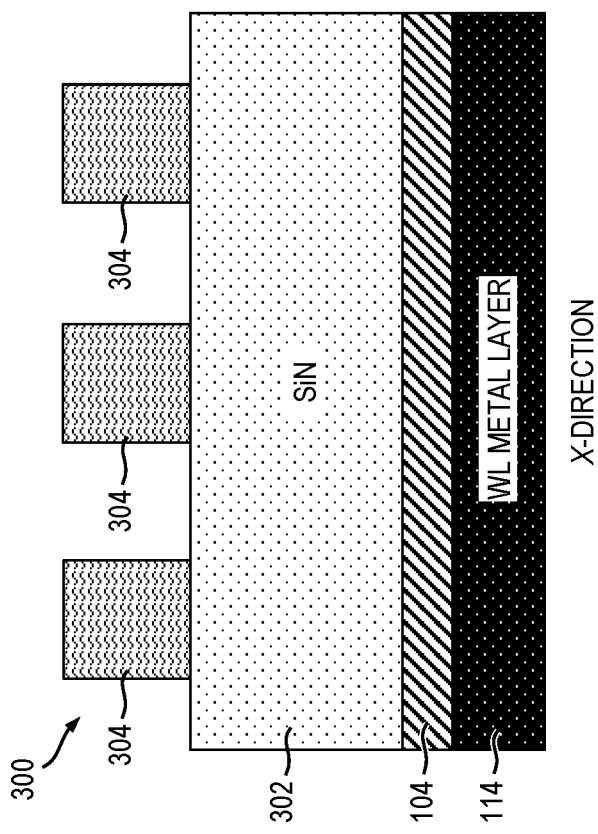
Figure 3C:
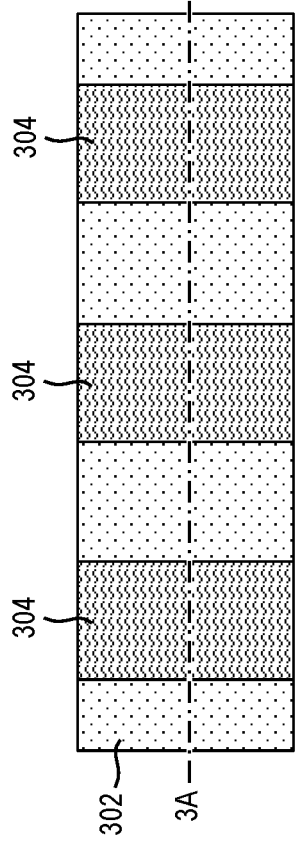

With reference to FIGS. 3A-3D, a first step 300 in an exemplary method of fabricating a stackable single-layer crosspoint memory array structure is shown, according to an embodiment of the invention; FIG. 3A is a cross-sectional view of the memory array structure in a first direction (x-direction) taken along line 3A-3A' of FIG. 3C, FIG. 3B is a cross-sectional view of the memory array structure in a second direction (y-direction), orthogonal to the first direction, taken along line 3B-3B' of FIG. 3D, FIG. 3C is a top plan view of the memory array structure in the first direction, and FIG. 3D is a top plan view of the memory array structure in the second direction. In step 300, it is presumed that a first wiring layer 114, which may be a word line layer, has already been formed, such as, for example on a silicon substrate or the like; the first wiring layer 114 serves as a base upon which subsequent processing layers are disposed.

Next, access device layers 104 are formed on an upper surface of the first wiring layer 114. As previously stated in conjunction with FIGS. 1A-1D, the access device layers 104, although not explicitly depicted as individual layers, preferably comprise top and bottom electrodes and access device material (i.e., selector material), the access device material being sandwiched between the top and bottom electrodes, as will be understood by those skilled in the art. A dielectric layer 302, such as, for example, silicon nitride (SiN), is formed on an upper surface (e.g., top electrodes) of the access device layers 104. Next, a photoresist masking layer 304 is formed on an upper surface of the dielectric layer 302 and patterned using, for example, a standard photolithography process, sidewall image transfer (SIT) process, or the like, followed by etching. In this instance, the etching is preferably selective such that only certain prescribed portions of the masking layer 304 are removed.

Figure 4B:
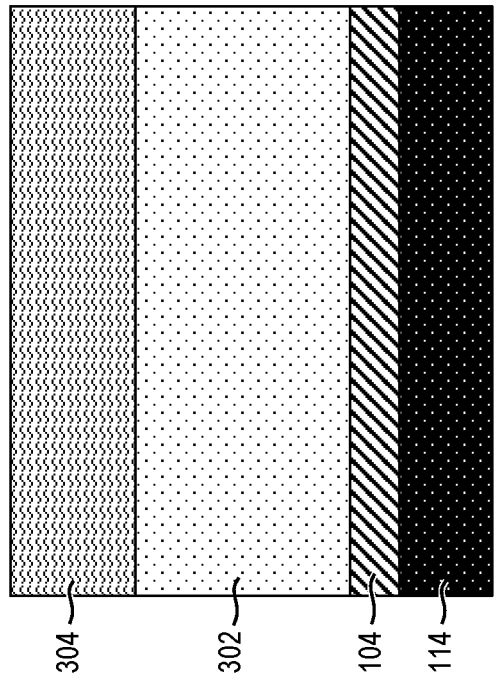
Figure 4A:
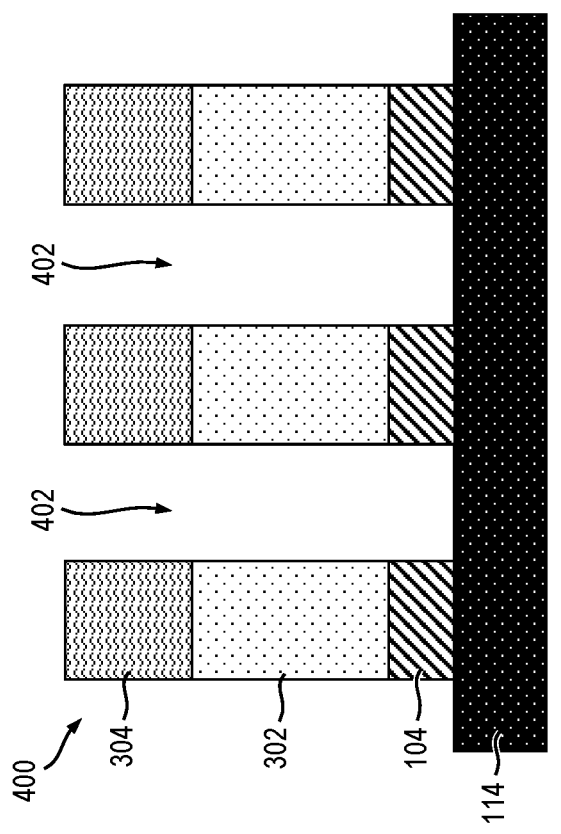
Figure 4D:
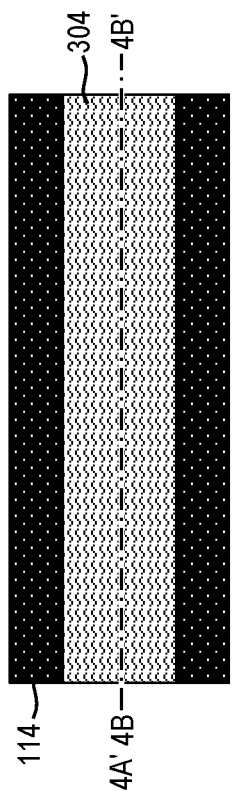
Figure 4C:
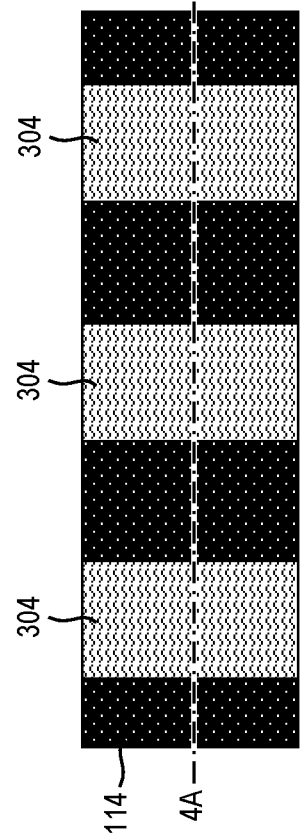

FIGS. 4A-4D depict a subsequent step 400 in the exemplary method of fabricating the single-layer crosspoint memory array structure, according to an embodiment of the invention; FIG. 4A is a cross-sectional view of the memory array structure in a first direction (x-direction) taken along line 4A-4A' of FIG. 4C, FIG. 4B is a cross-sectional view of the memory array structure in a second direction (y-direction), orthogonal to the first direction, taken along line 4B-4B' of FIG. 4D, FIG. 4C is a top plan view of the memory array structure in the first direction, and FIG. 4D is a top plan view of the memory array structure in the second direction. In step 400, RIE is performed to create a plurality of deep trenches 402 in portions of the memory array structure unprotected by the masking layer 304. The trenches 402 are formed through the dielectric layer 302 and access device layers 104, exposing the upper surface of the first wiring layer 114. In this manner, the first wiring layer 114 is effectively used as an etch-stop layer. At this point, post-RIE processing can be performed, including wet cleans, anneals, gas exposures, etc., with the purpose of removing RIE residuals and with the purpose of exposing the selector material to optimized temperatures and gases and in general, processing conditions to enhance, control, tune, or shift the performance and characteristics of the access device.

After step 400, in one or more embodiments, a low-temperature dielectric layer (e.g., $Si_xO_y$ or $Si_xN_y$) may be optionally deposited to form a spacer (not explicitly shown, but implied) protecting the access device/selector material in the access device layers 104, and then RIE the first wiring layer 114, and then use an orthogonal line cut down to (but not including) the first wiring level. The first wiring layer 114 could be etched with a first line cut or a second line cut (as is currently shown). Regardless of whether the first wiring layer is etched with a first line cut or second line cut, the first wiring layer 114 and second wiring layer 116 are oriented orthogonal relative to one another, in one or more embodiments.

Figure 5B:
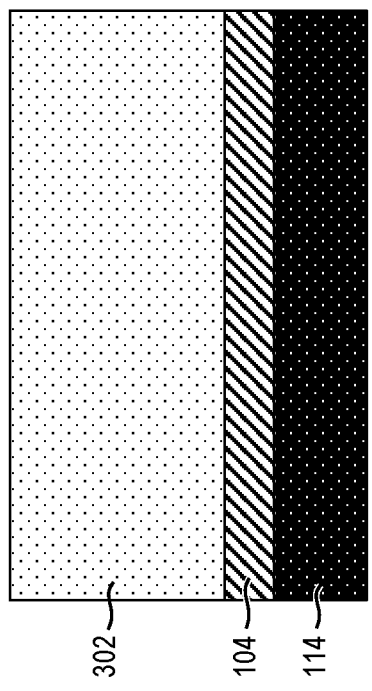
Figure 5D:
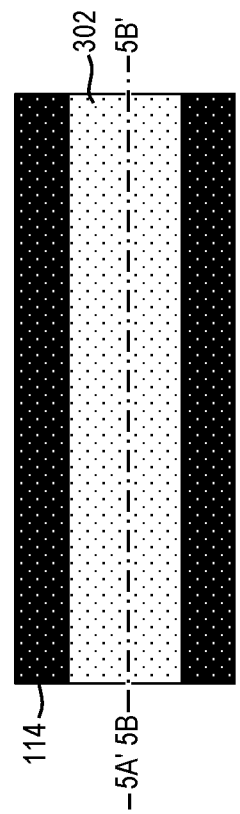
Figure 5A:
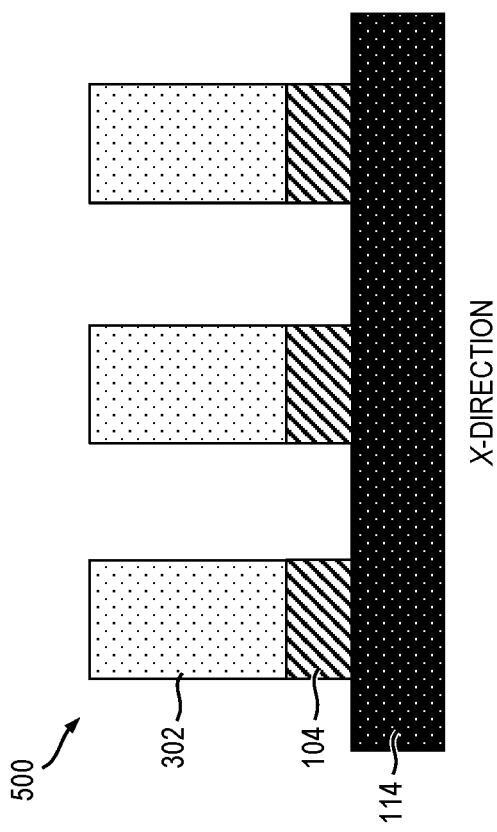
Figure 5C:
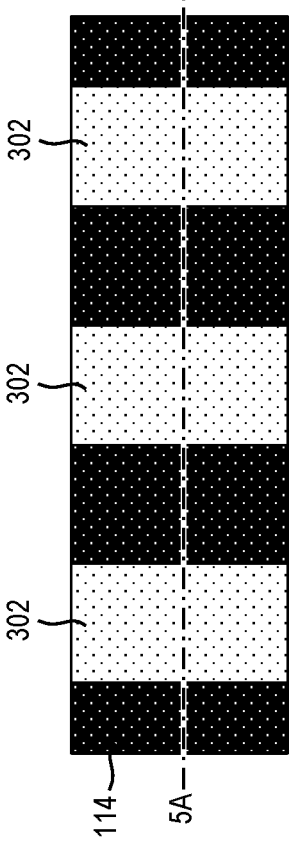

In another step 500 of the exemplary method of fabricating the single-layer crosspoint memory array structure according to an embodiment of the invention, the masking layer 304 is stripped away using, for example, a wet etch (e.g., HF solution, etc.), resulting in the structure shown in FIGS. 5A-5D; FIG. 5A is a cross-sectional view of the memory array structure in a first direction (x-direction) taken along line 5A-5A' of FIG. 5C, FIG. 5B is a cross-sectional view of the memory array structure in a second direction (y-direction), orthogonal to the first direction, taken along line 5B-5B' of FIG. 5D, FIG. 5C is a top plan view of the memory array structure in the first direction, and FIG. 5D is a top plan view of the memory array structure in the second direction.

With reference now to FIGS. 6A-6D, an insulating layer 112 is formed (e.g., deposition, oxide growth, etc.) over the upper surface of the memory array structure in step 600, filling in the trenches (402 in FIG. 4A) and surrounding adjacent memory cells in the structure, according to an embodiment of the invention; FIG. 6A is a cross-sectional view of the memory array structure in the first direction taken along line 6A-6A' of FIG. 6C, FIG. 6B is a cross-sectional view of the memory array structure in the second direction taken along line 6B-6B' of FIG. 6D, FIG. 6C is a top plan view of the memory array structure in the first direction, and FIG. 6D is a top plan view of the memory array structure in the second direction. After forming the insulating layer 112, chemical mechanical polishing (CMP), or an alternative planarization process, is preferably used to planarize the upper surface of the structure. The insulting layer 112 may be formed of essentially any non-conductive material, such as, for example, silicon dioxide, silicon nitride, or the combination of a thin ALD silicon nitride followed by a reflowable silicon or carbon based plasma-enhanced chemical vapor deposition (PECVD) or spin-on material, or a reflowable silicon or carbon based PECVD or spin-on material, etc.

FIGS. 7A-7D illustrate another step 700 in the exemplary method of fabricating the memory array structure, according to an embodiment of the invention, where FIG. 7A is a cross-sectional view of the memory array structure in the first direction taken along line 7A-7A' of FIG. 7C, FIG. 7B is a cross-sectional view of the memory array structure in the second direction taken along line 7B-7B' of FIG. 7D, FIG. 7C is a top plan view of the memory array structure in the first direction, and FIG. 7D is a top plan view of the memory array structure in the second direction. In step 700, a photoresist masking layer 702 is formed on an upper surface of the structure (e.g., using a deposition process). The masking layer 702 is then patterned, for example using a standard photolithography process, SIT process, or the like, and etched.

In step 800, portions of the memory array structure not protected by the masking layer 702 are subsequently removed, such as by using RIE or an alternative removal process, as shown in FIGS. 8A-8D; FIG. 8A is a cross-sectional view of the memory array structure in the first direction taken along line 8A-8A' of FIG. 8C, FIG. 8B is a cross-sectional view of the memory array structure in the second direction taken along line 8B-8B' of FIG. 8D, FIG. 8C is a top plan view of the memory array structure in the first direction, and FIG. 8D is a top plan view of the memory array structure in the second direction. In step 800, the etching process preferably removes all layers left exposed by the masking layer 702, including the dielectric layer 302, access device layers 104 and first wiring layer 114, thereby creating openings 802 between adjacent memory cell regions in the memory array structure. In this embodiment, the etching is performed completely through the first wiring layer 114 when viewed in the y direction. It is to be appreciated, however, that in one or more other embodiments, the etching may be performed completely through the first wiring layer when viewed in the x direction instead. In either case, the direction of the first and second wiring layers, 114 and 116, respectively, are orthogonal to one another, as shown in FIGS. 1A and 1B.

Alternatively, step 800, in one or more embodiments, can include an etching process for removing layers left exposed by the masking layer 702 including the dielectric layer 302 and the access device layers 104, after which point a thin (possibly ALD-based, possibly low-temperature (e.g. <200° C.)) $Si_xO_y$ or $Si_xN_y$ material is deposited and etched into a protective spacer using RIE (protecting the selector material), and then the first wiring layer 114 is removed (possibly with RIE or an alternative etching process). In a similar manner, this same methodology can be used in forming memory cells in a second memory layer (e.g., 100b in FIG. 2A), in the context of the double-layer memory array structure.

In step 900, the masking layer 702 is stripped from the upper surface of the memory array structure, as shown in FIGS. 9A-9D, where FIG. 9A is a cross-sectional view of the memory array structure in the first direction taken along line 9A-9A' of FIG. 9C, FIG. 9B is a cross-sectional view of the memory array structure in the second direction taken along line 9B-9B' of FIG. 9D, FIG. 9C is a top plan view of the memory array structure in the first direction, and FIG. 9D is a top plan view of the memory array structure in the second direction. The masking layer 702 may be removed using, for example, etching or CMP, but embodiments of the invention are not limited to any specific material removal method.

With reference to FIGS. 10A-10D, where FIG. 10A is a cross-sectional view of the memory array structure in the first direction taken along line 10A-10A' of FIG. 10C, FIG. 10B is a cross-sectional view of the memory array structure in the second direction taken along line 10B-10B' of FIG. 10D, FIG. 10C is a top plan view of the memory array structure in the first direction, and FIG. 10D is a top plan view of the memory array structure in the second direction, step 1000 depicts filling in of the regions surrounding adjacent memory cell regions with the insulting layer 112. Step 1000 may comprise, for example, performing a blanket deposition over the memory array structure, or oxide growth, etc., followed by CMP to planarize the insulating layer 112 with the upper surface of the structure.

Figure 11A:
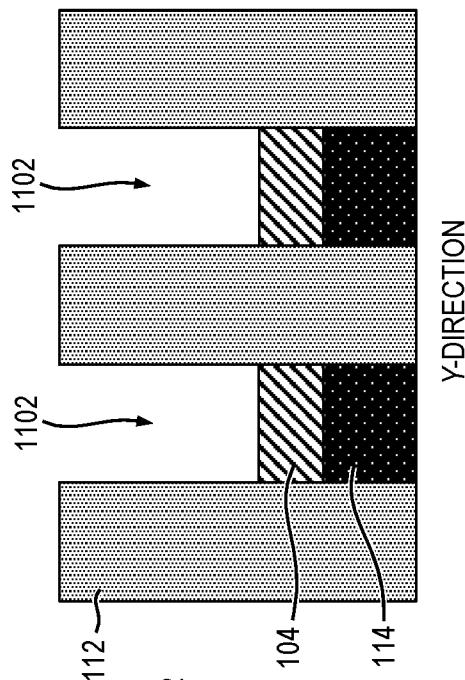
Figure 11B:
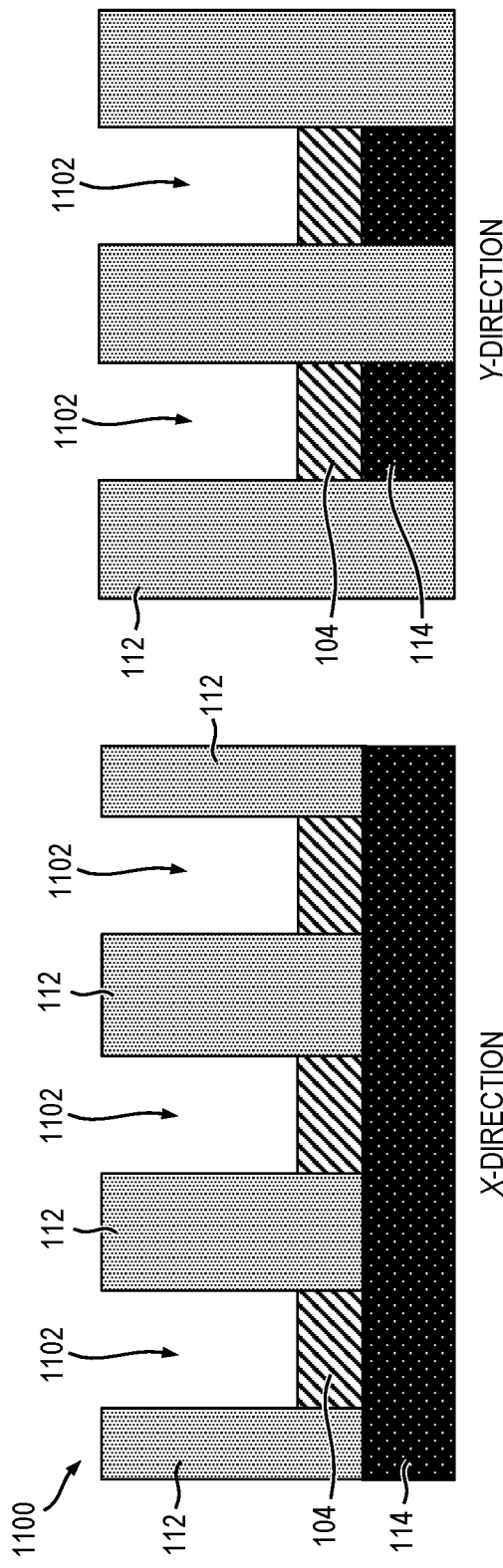
Figure 11C:
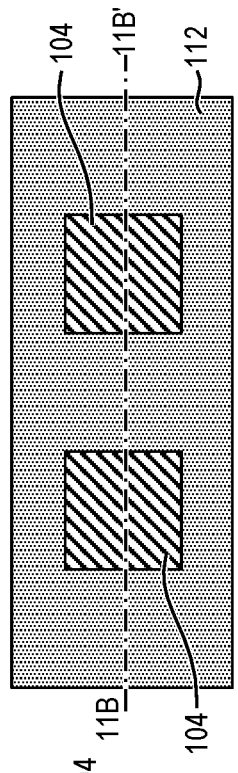
Figure 11D:
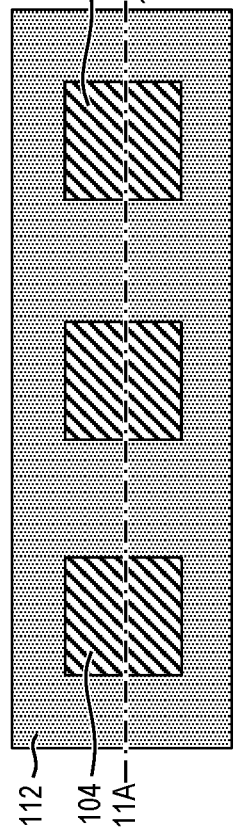

The dielectric layer 302 is then selectively recessed in step 1100, such as, for example, by using RIE or wet chemistry (e.g., phosphoric acid), to create openings 1102 in the memory array structure, as shown in FIGS. 11A-11D; FIG. 11A is a cross-sectional view of the memory array structure in the first direction taken along line 11A-11A' of FIG. 11C, FIG. 11B is a cross-sectional view of the memory array structure in the second direction taken along line 11B-11B' of FIG. 11D, FIG. 11C is a top plan view of the memory array structure in the first direction, and FIG. 11D is a top plan view of the memory array structure in the second direction. The dielectric layer 302 is preferably recessed down to the access device layers 104 such that the access device layers define a bottom wall of the openings 1102.

FIGS. 12A-12D depict step 1200, which is an optional step, for forming a dielectric collar 108, which may comprise silicon nitride (SiN) and/or another dielectric material(s), in each of at least a subset of the openings 1102, according to an embodiment of the invention; FIG. 12A is a cross-sectional view of the memory array structure in the first direction taken along line 12A-12A' of FIG. 12C, FIG. 12B is a cross-sectional view of the memory array structure in the second direction taken along line 12B-12B' of FIG. 12D, FIG. 12C is a top plan view of the memory array structure in the first direction, and FIG. 12D is a top plan view of the memory array structure in the second direction. The dielectric collars 108, which are formed, in one or more embodiments, using a deposition process followed by RIE or similar, serves to reduce a diameter of the openings 1102 by a thickness of the dielectric collars, and, furthermore, form a protective layer which will surround each of at least a subset of the memory cells. The dielectric collars 108, in this illustrative embodiment, are formed on sidewalls of the openings 1102, with the top electrode of the exposed access device layers 104 forming the bottom wall of each of the openings. In one or more embodiments wherein step 1200 is omitted, process flows to step 1300, described in further detail below in conjunction with FIGS. 13A-13D.

With reference now to FIGS. 13A-13D, of which FIG. 13A is a cross-sectional view of the memory array structure in the first direction taken along line 13A-13A' of FIG. 13C, FIG. 13B is a cross-sectional view of the memory array structure in the second direction taken along line 13B-13B' of FIG. 13D, FIG. 13C is a top plan view of the memory array structure in the first direction, and FIG. 13D is a top plan view of the memory array structure in the second direction, step 1300 depicts a liner 110 formed over the memory array structure—on the upper surface of the insulating layer 112, an upper surface of the dielectric collars 108 and sidewalls and a bottom wall of each of at least a subset of the openings 1102. The liner 110, in one or more embodiments, is formed of at least a partially conductive material, for example a metal nitride such as, but not limited to, TaN, TaTiN, TaAlN, TaSiN, TiN, TiSiN, TaTiAlN, or combinations of these layers, with a combined thickness between values of about 0.5 nm and 20 nm (in one exemplary embodiment, the thickness is about 6 nm), using a deposition process or similar.

In one or more embodiments, the liner 110 is configured (e.g., by selection of the liner material type, thickness, shape, etc.) so that a resistance of the liner is higher than the resistance of the phase change memory element in an amorphous phase (i.e., reset state), were the liner not present, so both the read current and the write current do not substantially flow through the liner. In another embodiment, the liner 110 is configured so that the resistance of the liner is less than the resistance of the phase change memory element in the amorphous phase, were the liner not present, so that the write current does not substantially flow through the liner but the read current does substantially flow through the liner, thereby mitigating a resistance drift phenomena in the memory cell.

It is to be understood that this same methodology of effectively "tuning" the liner 110 (e.g., adjusting the liner material type, dimensions, shape, etc.) to control the resistance of the liner, and thereby control the flow of read and/or write current in the memory cell as described above, can be similarly employed in forming memory cells in both the first and second memory layers in the context of fabricating a double-layer memory array structure, an illustrative embodiment of which is shown in FIGS. 2A and 2B (e.g., 200 in FIGS. 2A and 2B).

Figure 14A:
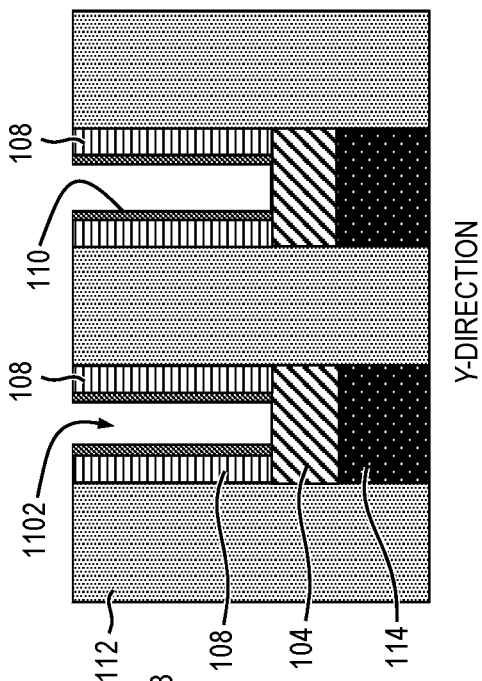
Figure 14B:
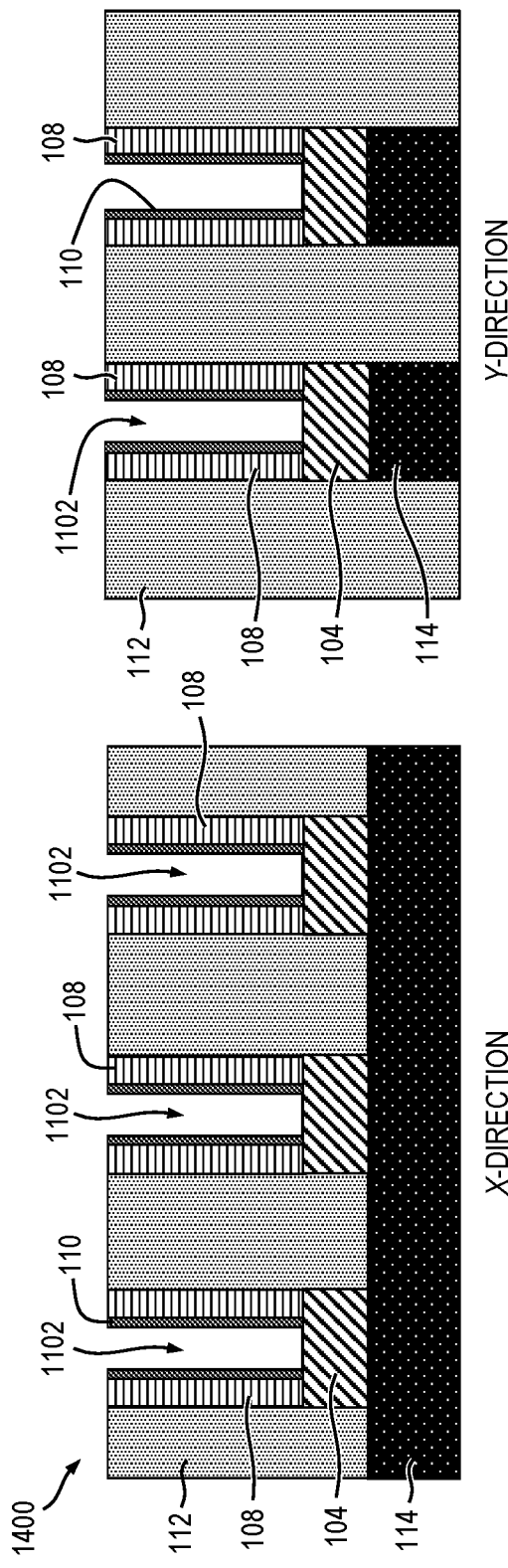
Figure 14C:
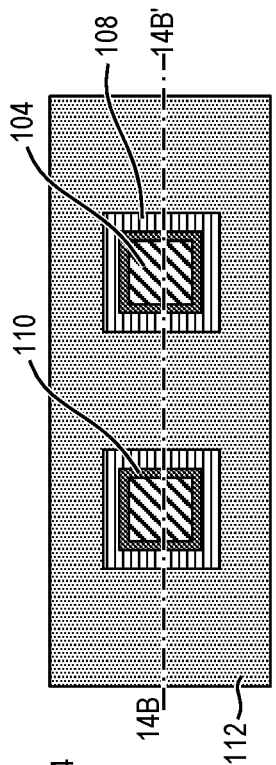
Figure 14D:
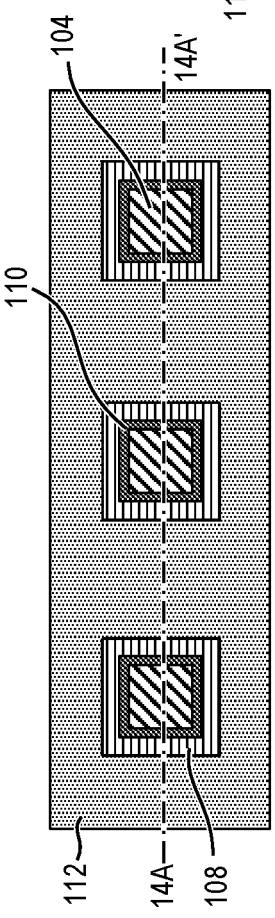

Horizontal surfaces of the liner 110 are subsequently optionally removed, for example using RIE or the like, as shown in step 1400 of FIGS. 14A-14D; FIG. 14A is a cross-sectional view of the memory array structure in the first direction taken along line 14A-14A' of FIG. 14C, FIG. 14B is a cross-sectional view of the memory array structure in the second direction taken along line 14B-14B' of FIG. 14D, FIG. 14C is a top plan view of the memory array structure in the first direction, and FIG. 14D is a top plan view of the memory array structure in the second direction. The liner 110 following RIE will form a collar structure on sidewalls of the openings 1102 (i.e., on opposing side surfaces of the dielectric collars 108), with the bottom walls of the openings exposing the upper surface (top electrode) of the access device layers 104. Optionally, in one or more embodiments, an over-etch is performed into the underlying top electrode of the access device layers 104 so as to allow for an increased surface area connecting the subsequently-deposited phase change material and the lower electrode material.

In one or more alternative embodiments, the liner is not removed from the bottom wall of the openings 1102. In this embodiment, the material used for the liner 110 can be conductive but it need not have a high electrical conductivity, provided a thickness of the liner remaining on the bottom wall of the openings 1102 is sufficiently thin that current can still flow between the memory storage element and the corresponding access device in a given memory cell; that is, with a sufficiently thin liner, even if the resistivity of the liner material were significantly high, a resistance of the bottom wall of the openings can still be negligible.

In step 1500, the openings 1102 are filled with a memory storage material 106 (e.g., phase change material, in the context of a PCM cell) using, for example, atomic layer deposition (ALD) chemical vapor deposition (CVD), electroplating techniques, solution-based deposition techniques, or physical vapor deposition (PVD) plus reflow techniques, such that a bottom terminal region 1502 of the memory storage material 106 is in contact, either directly or indirectly (e.g., through the liner on the bottom wall of the openings 1102, if present) with the top electrode of the access device layers 104 exposed within the openings, as shown in FIGS. 15A-15D; FIG. 15A is a cross-sectional view of the memory array structure in the first direction taken along line 15A-15A' of FIG. 15C, FIG. 15B is a cross-sectional view of the memory array structure in the second direction taken along line 15B-15B' of FIG. 15D, FIG. 15C is a top plan view of the memory array structure in the first direction, and FIG. 15D is a top plan view of the memory array structure in the second direction. A suitable phase change material 106 for use with one or more embodiments of the invention comprises a chalcogenide, such as, but not limited to, germanium-antimony-tellurium (GeSbTe or GST); other suitable phase change materials may be similarly employed, as will be known to those skilled in the art. In other (non-PCM) embodiments, a different type of material storage material may be deposited to form the storage element, as previously stated. After depositing the memory storage material 106 in the openings 1102, any phase change material which was deposited outside the openings 1102, such as on a field region of the structure, is removed using RIE, CMP, or the like, yielding the structure shown in FIGS. 15A-15D.

In step 1600 shown in FIGS. 16A-16D, a second conductive wiring layer 116, in which bit lines may be formed, is formed on the upper surface of the memory array structure, and specifically in electrical connection with a top electrode portion 1602 of the phase change material 106, according to an embodiment of the invention; FIG. 16A is a cross-sectional view of the memory array structure in the first direction taken along line 16A-16A' of FIG. 16C, FIG. 16B is a cross-sectional view of the memory array structure in the second direction taken along line 16B-16B' of FIG. 16D, FIG. 16C is a top plan view of the memory array structure in the first direction, and FIG. 16D is a top plan view of the memory array structure in the second direction. In one or more embodiments, the second wiring layer 116, which may comprise a metal or metal alloy, such as, for example, tungsten (W), or WN plus W, is formed using a deposition process, although embodiments of the invention are not limited to this method. Optionally, the top electrode portion 1602 may include the deposition of a metal or metal alloy, such as, for example, titanium or titanium nitride (Ti/TiN) to provide a better ohmic contact with the second wiring layer 116.

In step 1700, depicted in FIGS. 17A-17D, a photoresist masking layer 1702 is formed on an upper surface of the second wiring layer 116 (e.g., using a deposition process). FIG. 17A is a cross-sectional view of the memory array structure in the first direction taken along line 17A-17A' of FIG. 17C, FIG. 17B is a cross-sectional view of the memory array structure in the second direction taken along line 17B-17B' of FIG. 17D, FIG. 17C is a top plan view of the memory array structure in the first direction, and FIG. 17D is a top plan view of the memory array structure in the second direction. The masking layer 1702 is patterned, for example using a standard photolithography process, SIT process, or the like, and then etched.

Figure 18A:
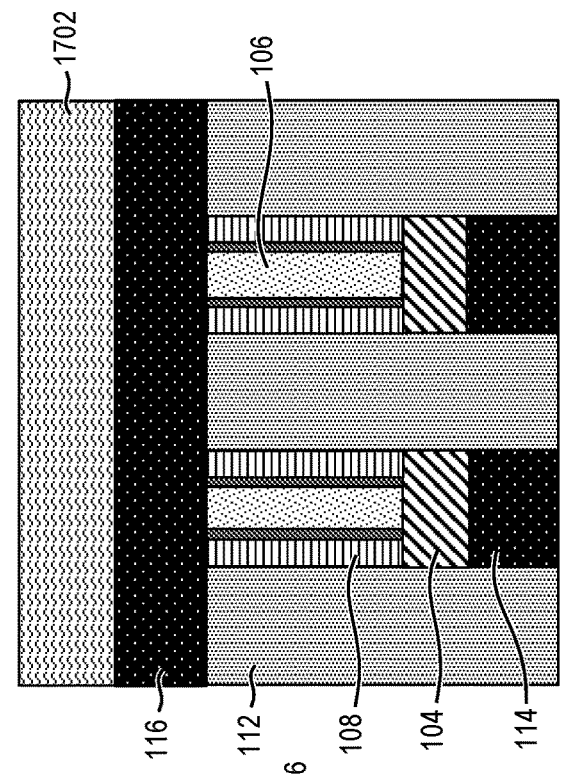
Figure 18B:
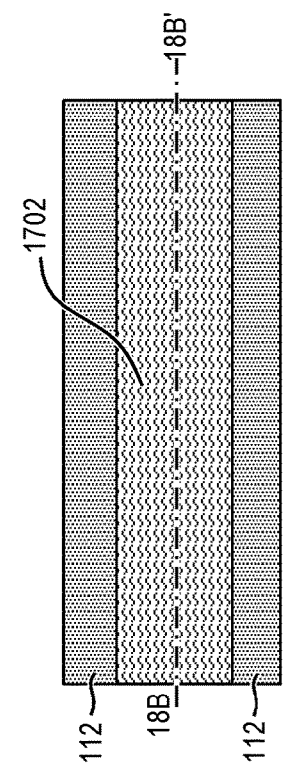
Figure 18C:
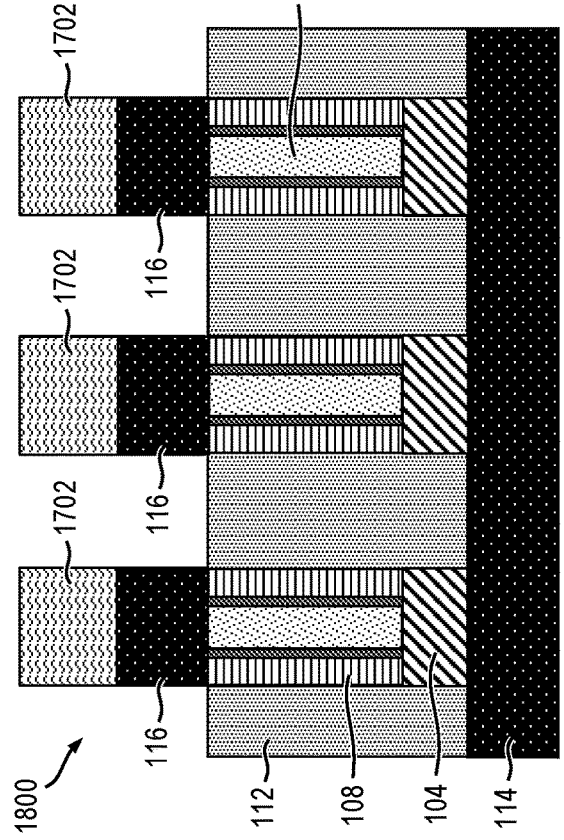
Figure 18D:
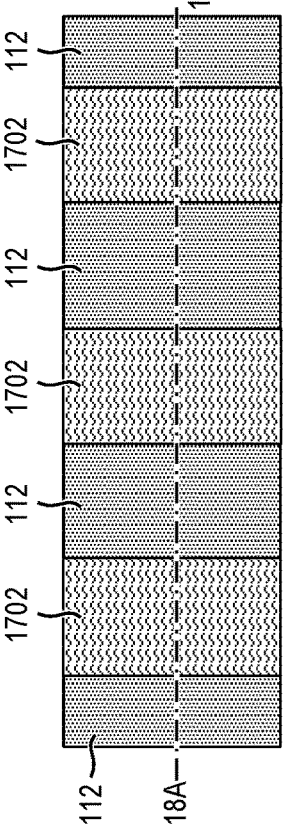

The second wiring layer 116 is subsequently etched using, for example, RIE or a similar etching process, such that the portions of the wiring layer not protected by the masking layer 1702 are removed, thereby exposing the upper surface of the insulating layer 112, thus yielding the structure shown in FIGS. 18A-18D, where FIG. 18A is a cross-sectional view of the memory array structure in the first direction taken along line 18A-18A' of FIG. 18C, FIG. 18B is a cross-sectional view of the memory array structure in the second direction taken along line 18B-18B' of FIG. 18D, FIG. 18C is a top plan view of the memory array structure in the first direction, and FIG. 18D is a top plan view of the memory array structure in the second direction. The masking layer 1702 is then stripped from the upper surface of the memory array structure, as shown in FIGS. 19A-19D, where FIG. 19A is a cross-sectional view of the memory array structure in the first direction taken along line 19A-19A' of FIG. 19C, FIG. 19B is a cross-sectional view of the memory array structure in the second direction taken along line 19B-19B' of FIG. 19D, FIG. 19C is a top plan view of the memory array structure in the first direction, and FIG. 19D is a top plan view of the memory array structure in the second direction. The masking layer 1702 is removed, in one or more embodiments, using an etching or CMP process, although embodiments of the invention are not limited to any specific removal method.

Figure 20B:
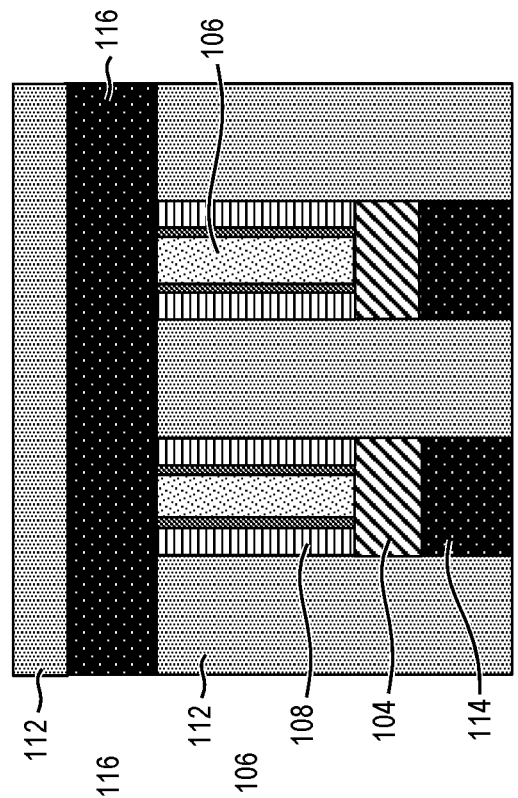
Figure 20A:
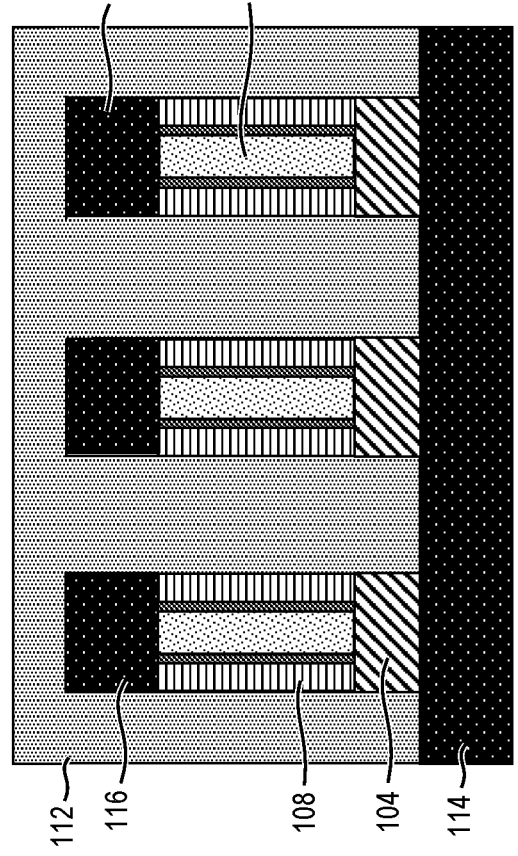
Figure 20D:
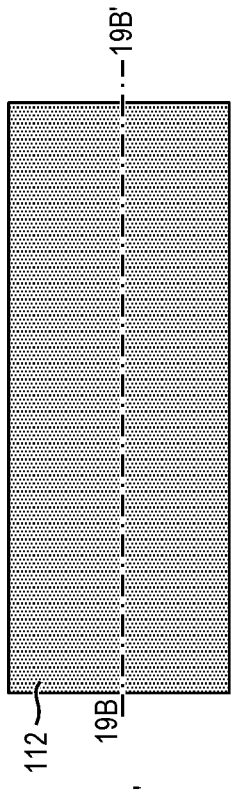
Figure 20C:
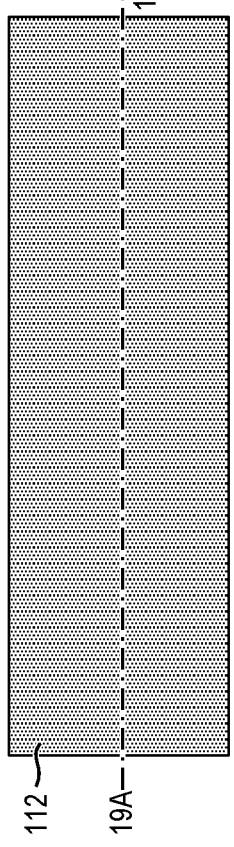

Spaces 1902 between adjacent bit lines 116 in the second wiring layer are subsequently filled in with an insulating material in step 2000, as depicted in FIGS. 20A-20D; FIG. 20A is a cross-sectional view of the memory array structure in the first direction taken along line 20A-20A' of FIG. 20C, FIG. 20B is a cross-sectional view of the memory array structure in the second direction taken along line 20B-20B' of FIG. 20D, FIG. 20C is a top plan view of the memory array structure in the first direction, and FIG. 20D is a top plan view of the memory array structure in the second direction. The insulating material, in one or more embodiments, may be an extension of the insulating layer 112 using, for example, a growth (e.g., oxide growth) or deposition process. After performing a planarization process, such as CMP or the like, the exemplary single-layer crosspoint memory array structure 100 shown in the illustrative embodiment of FIGS. 1A-1D is obtained.

By way of example only and without limitation, a description of an illustrative process flow for fabricating the stackable double-layer crosspoint PCM memory array structure 200 shown in FIGS. 2A and 2B will now be described in conjunction with FIGS. 21A, 21B, 22A, 22B, 23A, 23B, 24A, 24B, 25A, 25B, 26A, 26B, 27A, 27B, 28A and 28B, according to one or more embodiments of the invention.

Figures 21A, 21B:
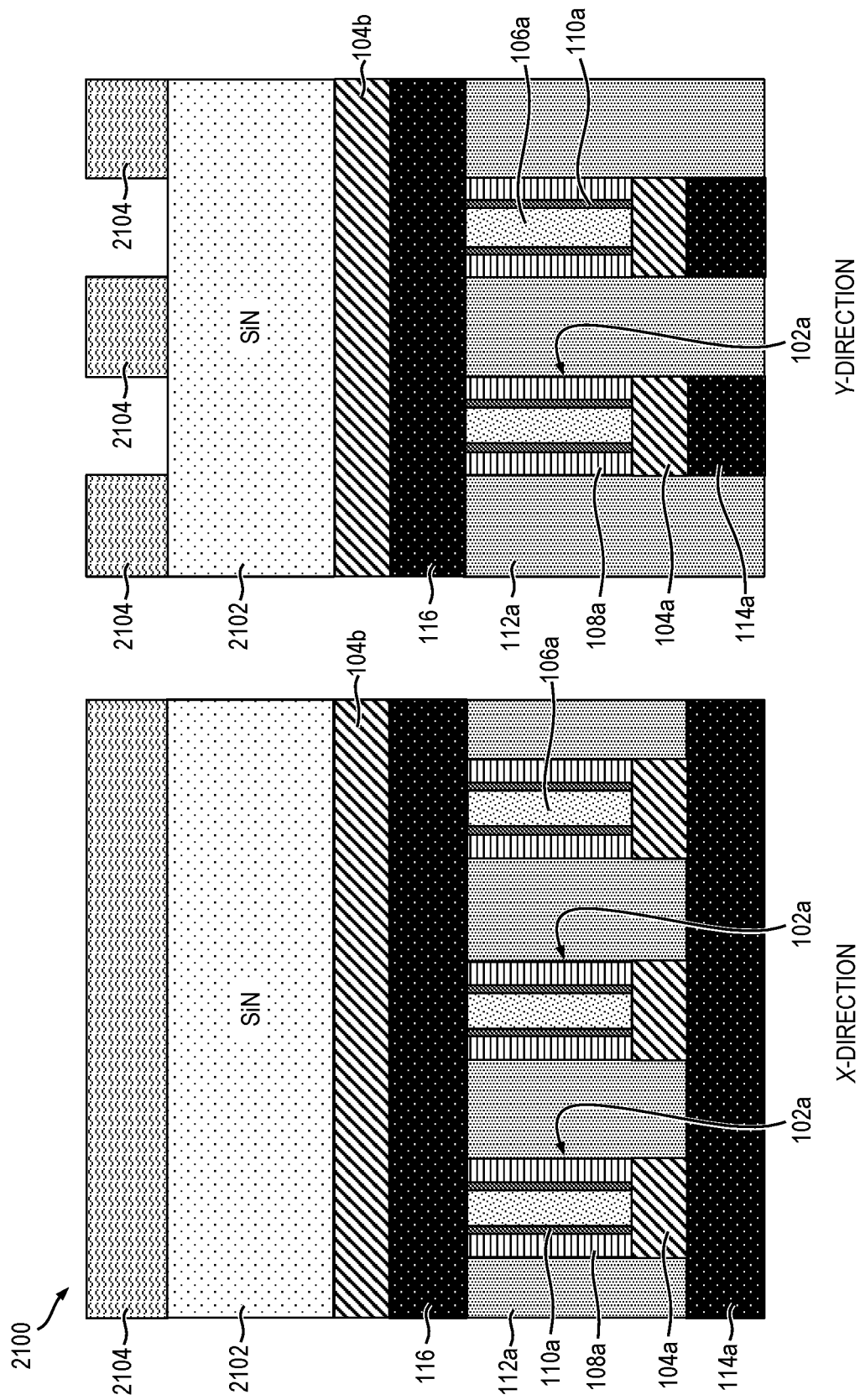

With reference to FIGS. 21A and 21B, this illustrative embodiment utilizes, as a foundation structure, a single-layer crosspoint memory array structure including a plurality of memory cells and first and second wiring layers 114a and 116, respectively. Each of at least a subset of the memory cells includes a PCM storage element 102a formed on a corresponding etched access device 104a in a 4F2 crosspoint array, where F is the minimum resolvable feature size. The PCM storage elements 102a and corresponding access devices 104a, in this embodiment, may be formed in a manner consistent with the storage elements 102 and corresponding access devices 104, respectively, shown in FIGS. 1A-1D. Each of at least a subset of the storage elements 102a, in this embodiment, comprises phase change material layer 106a surrounded by an optional dielectric collar 108a, which may be formed of, for example, SiN or another suitable material. The phase change material layer 106a, in one or more embodiments, comprises germanium-antimony-tellurium (GeSbTe or GST), but other phase change materials are similarly contemplated, as will be known to those skilled in the art. A liner 110a is preferably disposed between the dielectric collar 108a and the phase change material layer 106a. The liner 110a, in one or more embodiments, comprises a metal nitride layer (e.g., tantalum nitride (TaN), titanium nitride (TiN), tantalum silicon nitride (TaSiN), tantalum aluminum nitride (TaAlN), titanium aluminum nitride (TiAlN), titanium silicon nitride (TiSiN), etc.) and serves, at least in part, as a resistance drift stabilizer and to prevent phase change material 106a from diffusing into the dielectric collar 108a during subsequent processing or memory operation.

As previously stated in conjunction with FIGS. 1A-1D, the access device 104a can be any etched two-terminal device, such as, for example, a polysilicon diode, mixed ionic electronic conductor (MIEC) device, ovonic threshold switch (OTS), a Schottky diode, or the like. Although specific details of the access device 104a are omitted in the figures, it is to be understood that the access device implicitly includes the access device material sandwiched between top and bottom electrodes for providing electrical connection with the access device material.

With continued reference to FIGS. 21A and 21B, the second wiring layer 116, coupled with the top electrodes of the respective memory cells 102a is also used as a first wiring layer of a second layer of memory cells to be formed, which are stacked on the first layer of memory cells. Specifically, in step 2100, second access device layers 104b are formed on an upper surface of the second wiring layer 116. Although not explicitly shown, the second access device layers 104b, like the first access layers 104a, preferably comprise top and bottom electrodes, interface layers, and access device material, the access device material being sandwiched between the top and bottom electrodes and/or interface layers, as will be understood by those skilled in the art. A dielectric layer 2102, such as, for example, SiN, is formed on an upper surface (e.g., top electrodes) of the second access device layers 104b. Next, a photoresist masking layer 2104 is formed on an upper surface of the dielectric layer 2102 and patterned using, for example, a standard photolithography process, SIT process, or the like, followed by etching. In this instance, the etching is preferably selective such that only certain prescribed portions of the masking layer 2104 are removed.

In step 2200 shown in FIGS. 22A and 22B, RIE or another etching process is performed to create a plurality of deep trenches 2202 in portions of the memory array structure unprotected by the masking layer 2104. The trenches 2202 are formed through the dielectric layer 2102 and second access device layers 104b, exposing the upper surface of the second wiring layer 116. In this manner, the second wiring layer 116 serves as an etch-stop layer. Alternatively, in a manner consistent with step 800 described above, step 2200, in one or more embodiments, can include an etching process removing layers left exposed by the masking layer 2104 including the dielectric layer 2102 and the access device layers 104b, after which point a thin (possibly ALD-based, possibly low-temperature (e.g., <200° C.)) $Si_xO_y$ or $Si_xN_y$ material is deposited and etched into a protective spacer using RIE (protecting the selector material), and then at least a portion of the second wiring layer 116 is removed (possibly with RIE or an alternative etching process).

Figure 23B:
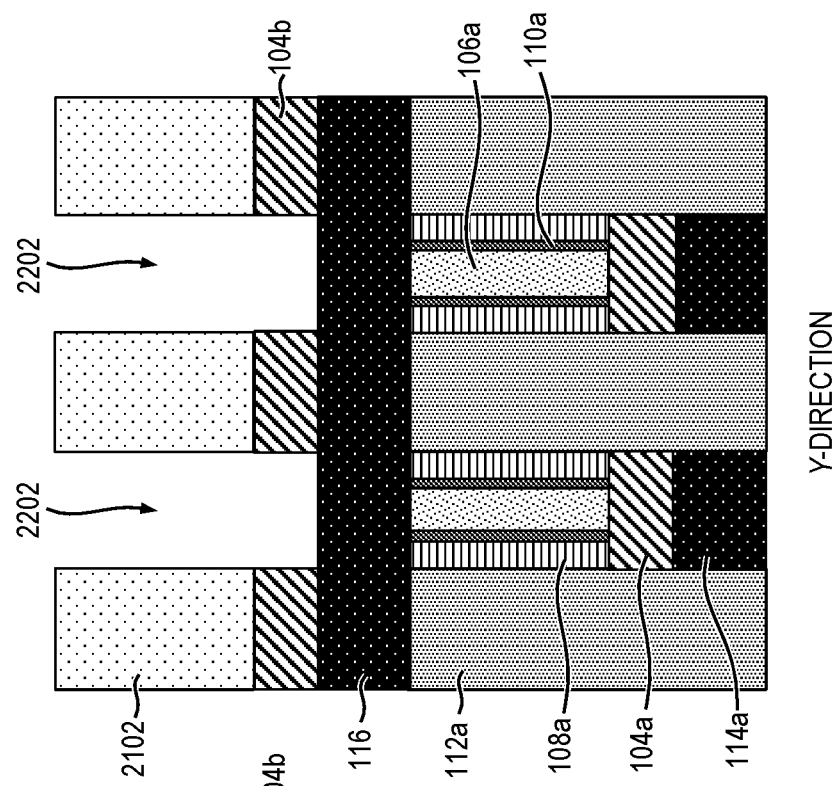
Figure 23A:
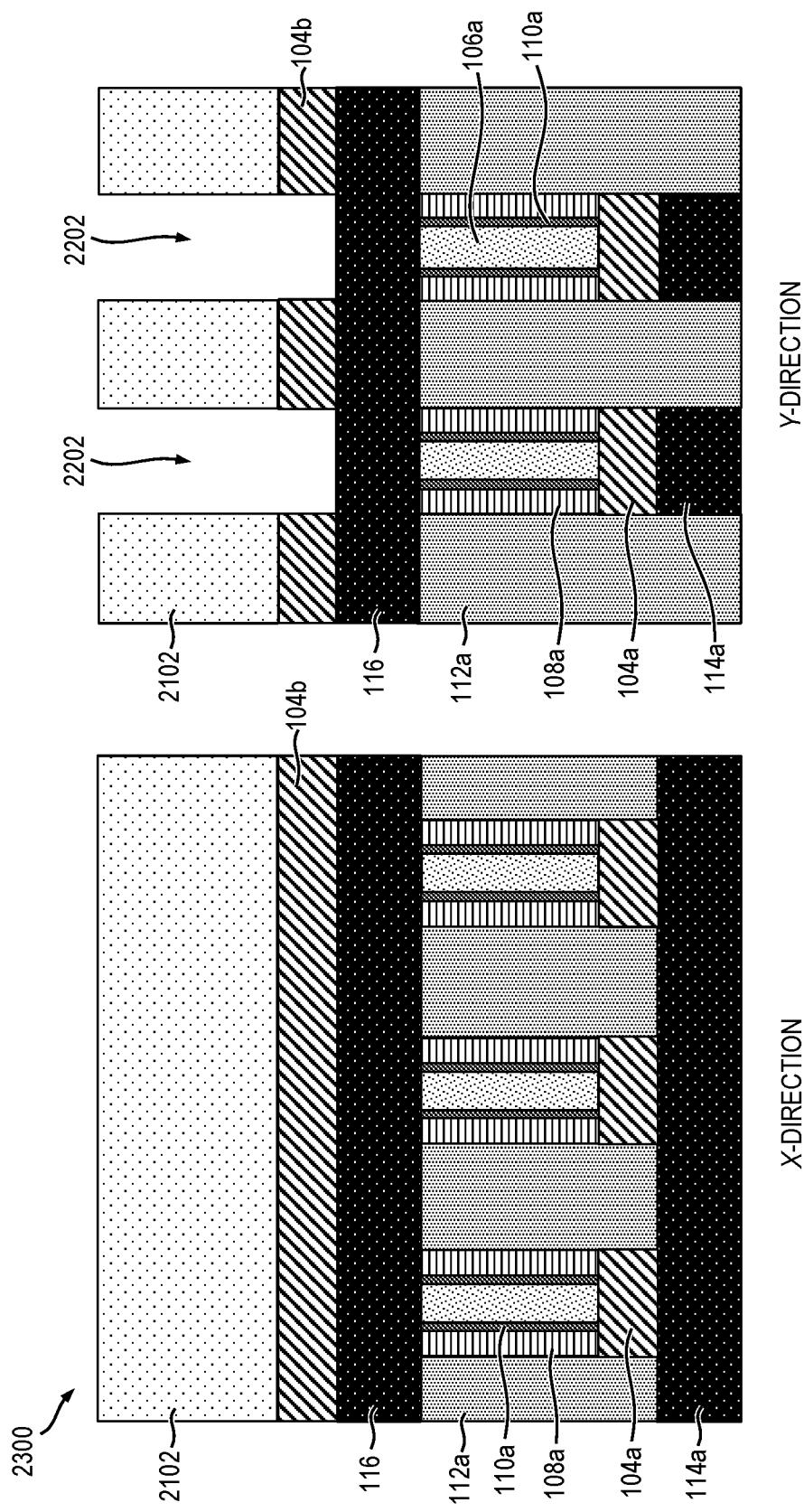

As depicted in FIGS. 23A and 23B, in step 2300 of the exemplary method of fabricating the double-layer crosspoint memory array structure according to an embodiment of the invention, the masking layer 2104 is stripped away using, for example, a wet etch (e.g., HF solution, etc.).

With reference to FIGS. 24A and 24B, an insulating layer 112b is formed (e.g., deposition, oxide growth, etc.) over the upper surface of the memory array structure in step 2400, filling in the trenches (2202 in FIG. 23B) and surrounding adjacent memory cells in the structure, according to an embodiment of the invention. After forming the insulating layer 112b, the upper surface of the double-layer memory array structure is planarized using, for example, CMP or the like. The insulting layer 112b, like insulating layer 112a, may be formed of essentially any non-conductive material, such as, but not limited to, silicon dioxide.

Figure 25B:
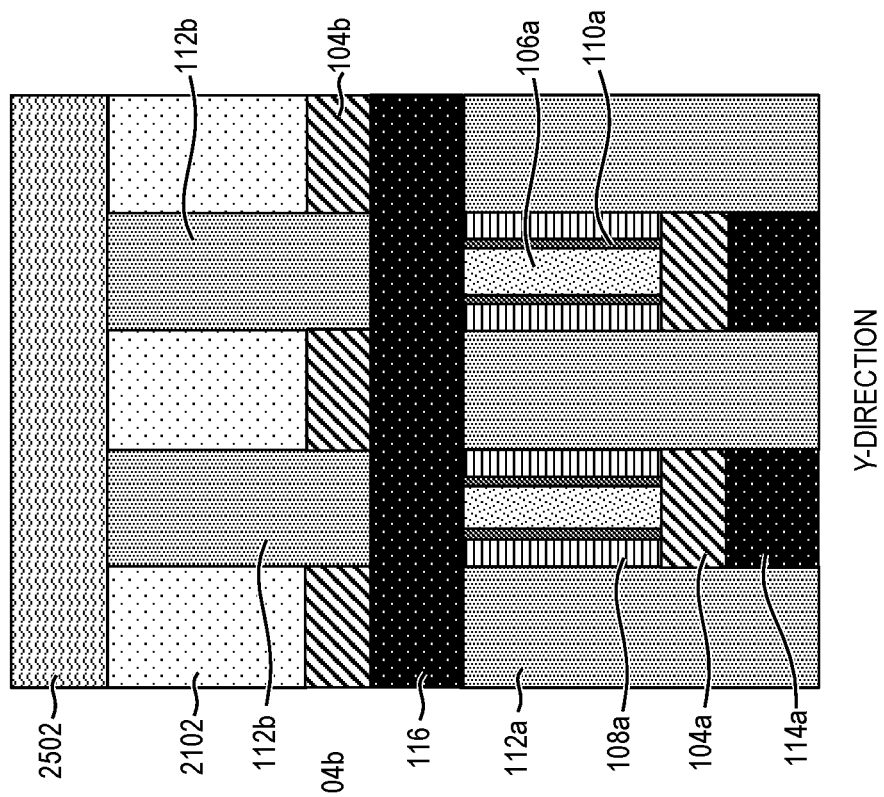
Figure 25A:
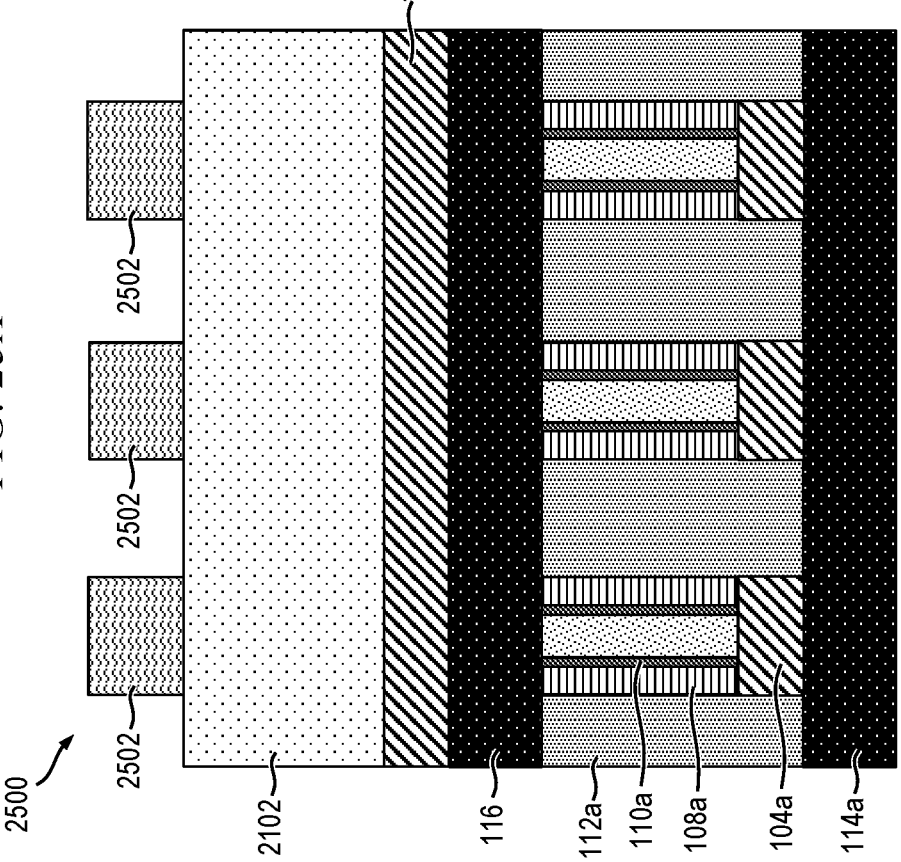
Figure 27B:
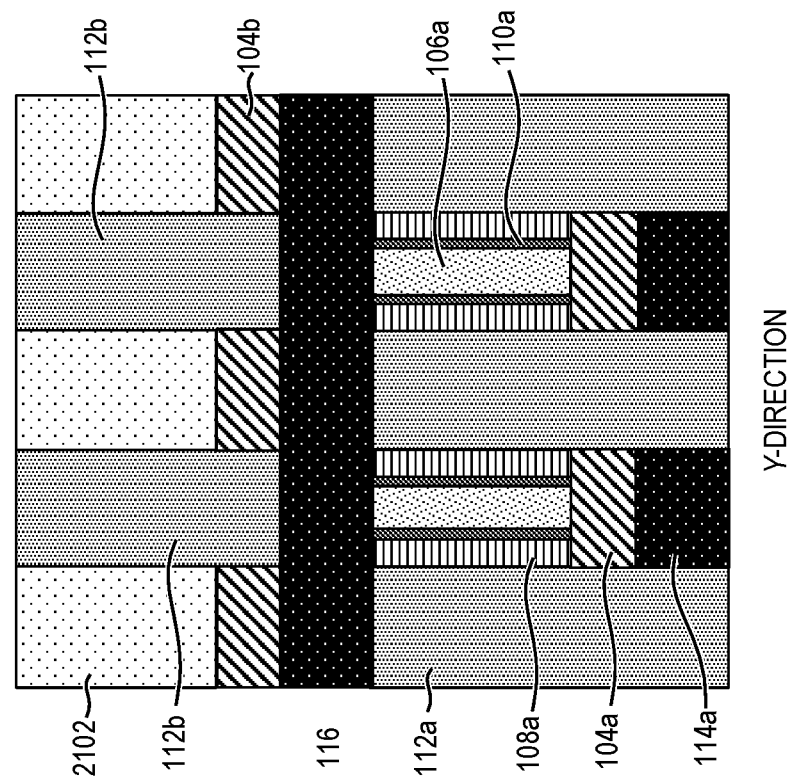
Figure 27A:
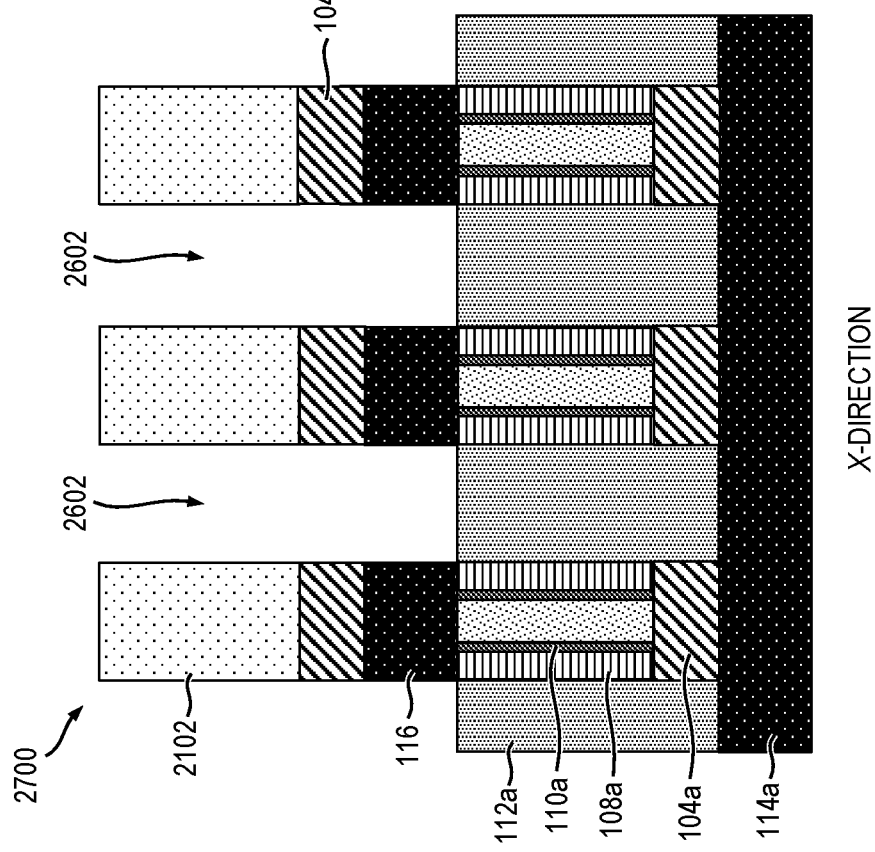

In step 2500 shown in FIGS. 25A and 25B, a photoresist masking layer 2502 is formed on an upper surface of the memory array structure; over the dielectric layer 2102 and insulting layer 112b (e.g., using a deposition process). The masking layer 2502 is patterned, for example using standard lithography process, a SIT process, or the like, and then etched. The memory array structure is subsequently etched in step 2600 using, for example, RIE or a similar etching process, such that the portions of the structure not protected by the masking layer 2502 are removed down to the insulating layer 112a in the first memory array layer to create trenches 2602 through which the upper surface of the insulating layer 112a is exposed, as shown in FIGS. 26A and 26B. The masking layer 2502 is then stripped from the upper surface of the memory array structure in step 2700, as illustrated in FIGS. 27A and 27B. The masking layer 2502 is removed, in one or more embodiments, using an etching or CMP process, although embodiments of the invention are not limited to any specific removal method.

With reference now to FIGS. 28A and 28B, spaces 2602 between adjacent memory cells in the second memory layer are subsequently filled in with an insulating material in step 2800, as depicted in FIGS. 28A and 28B. The insulating material, in one or more embodiments, may be an extension of the insulating layer 112b using, for example, a growth (e.g., oxide growth) or deposition process. Next, a planarization process is performed, such as CMP or the like. Similar steps are subsequently performed for forming the PCM storage elements in the second memory layer, consistent with steps 1100 through 1600 used for forming the PCM storage elements 102a in the first memory layer, to yield the exemplary double-layer memory array structure shown in FIGS. 3A and 3B.

Given the discussion thus far, it will be appreciated that, in general terms, an exemplary method of fabricating a memory array structure includes: forming at least one access device layer on an upper surface of a first conductive layer, the access device layer being in electrical connection with the first conductive layer; forming a sacrificial layer on an upper surface of the access device layer; etching the access device layer and the sacrificial layer using a same masking feature to form an access device that is self-aligned with a portion of the sacrificial layer; replacing a portion of the sacrificial layer with memory storage material to form a storage element, a first terminal of the storage element being in electrical connection with the access device; and forming a second conductive layer on an upper surface of the storage element, a second terminal of the storage element being in electrical connection with the second conductive layer.

Given the discussion thus far, it will be appreciated that, in general terms, an exemplary semiconductor memory array structure includes first and second conductive layers, the first and second conductive layers being oriented orthogonally relative to one another. The memory array structure further includes at least one etched access device formed on an upper surface of the first conductive layer and at least one fill-in storage element formed on and self-aligned with the access device. The storage element includes memory storage material surrounded by a liner, the liner being at least partially conductive. The storage element has a first terminal which is electrically connected with the access device, the access device being devoid of the liner, and a second terminal which is electrically connected with the second conductive layer. Optionally, the liner is formed on sidewalls and a bottom to thereby define a volume in which to contain the memory storage material.

At least a portion of the structures and methods described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having classification circuitry formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the structures and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure.

This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor memory array structure, comprising:
    first and second conductive layers, the first and second conductive layers being oriented orthogonally relative to one another;
    at least a first etched access device formed on an upper surface of the first conductive layer; and
    at least a first fill-in storage element formed on and self-aligned with the first etched access device, the first fill-in storage element comprising memory storage material surrounded by a liner, the liner being at least partially conductive, the first fill-in storage element having a first terminal which is electrically connected with the first etched access device, the first etched access device being devoid of the liner, the first fill-in storage element having a second terminal which is electrically connected with the second conductive layer.

2. The memory array structure of claim 1, wherein the first fill-in storage element further comprises a dielectric collar surrounding the liner.

3. The memory array structure of claim 1, wherein the memory array structure comprises at least first and second etched access devices and at least first and second fill-in storage elements, the first and second etched access devices formed on the upper surface of the first conductive layer, the first and second fill-in storage elements formed on and self-aligned with the first and second etched access devices, respectively, and wherein the memory array structure further comprises an insulating layer formed between the first and second etched access devices and between the first and second fill-in storage elements for electrically isolating the first etched access device from the second etched access device, and for electrically isolating the first fill-in storage element from the second fill-in storage element.

4. The memory array structure of claim 3, wherein the insulating layer comprises at least one of silicon dioxide and silicon nitride.

5. The memory array structure of claim 1, wherein the first etched access device comprises one of a polysilicon diode, a mixed ionic electronic conductor, and an ovonic threshold switch.

6. The memory array structure of claim 1, wherein the liner comprises a metal nitride and is configured to prevent the memory storage material from diffusing into surrounding material of the first fill-in storage element.

7. The memory array structure of claim 1, wherein the memory storage material in the first fill-in storage element comprises phase change material.

8. The memory array structure of claim 1, wherein the memory storage material in the first fill-in storage element comprises at least one of germanium-antimony-tellurium, hafnium oxide with a titanium buffer layer, a binary transition metal oxide, a solid-state electrolyte, an organic charge-transfer complex, and two-dimensional insulating materials.

9. The memory array structure of claim 1, further comprising:
    a third conductive layer, the third conductive layer being oriented orthogonally relative to the second conductive layer;
    a second etched access device formed on an upper surface of the second conductive layer and vertically aligned with the first etched access device; and
    a second fill-in storage element formed on and self-aligned with the second etched access device, the second fill-in storage element comprising memory storage material surrounded by a liner, the liner being at least partially conductive, the second fill-in storage element having a first terminal which is electrically connected with the second etched access device, the second etched access device being devoid of the liner, the second fill-in storage element having a second terminal which is electrically connected with the third conductive layer.

10. The memory array structure of claim 9, wherein the second fill-in storage element further comprises a dielectric collar surrounding the liner.

11. The memory array structure of claim 9, wherein the memory array structure further comprises third and fourth etched access devices and third and fourth fill-in storage elements, the third etched access device formed on the upper surface of the first conductive layer and the fourth etched access device formed on the upper surface of the second conductive layer and vertically aligned with the third etched access device, the third and fourth fill-in storage elements formed on and self-aligned with the third and fourth etched access devices, respectively, and wherein the memory array structure further comprises an insulating layer formed between the first and third etched access devices, between the second and fourth etched access devices, between the first and third fill-in storage elements, and between the second and fourth fill-in storage elements for electrically isolating the first and second etched access devices from the third and fourth etched access devices, and for electrically isolating the first and second fill-in storage elements from the third and fourth fill-in storage elements.

12. The memory array structure of claim 9, wherein at least one of the first and second etched access devices comprises one of a polysilicon diode, a mixed ionic electronic conductor, and an ovonic threshold switch.

13. The memory array structure of claim 9, wherein the memory storage material in at least one of the first and second fill-in storage elements comprises phase change material.

14. The memory array structure of claim 9, wherein the memory storage material in at least one of the first and second fill-in storage elements comprises at least one of germanium-antimony-tellurium, hafnium oxide with a titanium buffer layer, a binary transition metal oxide, a solid-state electrolyte, an organic charge-transfer complex, and two-dimensional insulating materials.

15. The memory array structure of claim 9, wherein the second etched access device and the first fill-in storage element are stacked on one another so as to share the second conductive layer.

* * * * *